(12) United States Patent
Kim

(10) Patent No.: US 12,543,580 B2
(45) Date of Patent: Feb. 3, 2026

(54) SEMICONDUCTOR PACKAGE

(71) Applicant: Samsung Electronics Co., Ltd., Suwon-si (KR)

(72) Inventor: Youngbae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 483 days.

(21) Appl. No.: 18/064,660

(22) Filed: Dec. 12, 2022

(65) Prior Publication Data

US 2023/0317625 A1   Oct. 5, 2023

(30) Foreign Application Priority Data

Apr. 1, 2022   (KR) .................... 10-2022-0041333

(51) Int. Cl.
*H01L 23/538* (2006.01)
*H01L 23/00* (2006.01)

(52) U.S. Cl.
CPC ...... *H01L 23/5386* (2013.01); *H01L 23/5383* (2013.01); *H01L 24/08* (2013.01); *H01L 2224/08235* (2013.01)

(58) Field of Classification Search
None
See application file for complete search history.

(56) References Cited

U.S. PATENT DOCUMENTS

| | | |
|---|---|---|
| 7,279,786 B2 | 10/2007 | Kim |
| 9,478,498 B2 | 10/2016 | Lin et al. |
| 10,651,053 B2 | 5/2020 | Liao et al. |
| 10,872,864 B2 | 12/2020 | Wang et al. |
| 11,031,342 B2 | 6/2021 | Tseng et al. |
| 11,031,375 B2 | 6/2021 | Lee et al. |
| 11,062,988 B2 | 7/2021 | Liao et al. |

(Continued)

FOREIGN PATENT DOCUMENTS

| | | |
|---|---|---|
| KR | 101099773 B1 | 12/2011 |
| KR | 10-2015-0057971 A | 5/2015 |

(Continued)

OTHER PUBLICATIONS

Office Action in Korean Appln. No. 10-2022-0041333, mailed on Oct. 29, 2025, 20 pages (with English translation).

*Primary Examiner* — Nilufa Rahim
(74) *Attorney, Agent, or Firm* — Fish & Richardson P.C.

(57) ABSTRACT

A semiconductor package includes: a plurality of lower redistribution line patterns, a plurality of lower redistribution via patterns, and a lower redistribution insulating layer surrounding the plurality of lower redistribution line patterns and the plurality of lower redistribution via patterns; an expanded layer at least partially defining a mounting space and including, on the lower redistribution layer, a via pad at least partially defining a via pad recess extending from a bottom surface of the via pad into the via pad, an expanded structure covering the via pad, and an extending via portion connected with the via pad through the expanded structure; and a semiconductor chip in the mounting space, on the lower redistribution layer, wherein, from among the lower redistribution via patterns, a lower redistribution via pattern connected with the via pad extends into the via pad while filling the via pad recess.

19 Claims, 19 Drawing Sheets

(56) References Cited

U.S. PATENT DOCUMENTS

| | | | |
|---|---|---|---|
| 11,823,981 B2 * | 11/2023 | Chang | H01L 21/76879 |
| 2010/0244244 A1 * | 9/2010 | Yang | H01L 23/481 |
| | | | 257/737 |
| 2011/0186960 A1 | 8/2011 | Wu et al. | |
| 2014/0175663 A1 * | 6/2014 | Chen | H01L 23/49816 |
| | | | 257/774 |
| 2018/0151500 A1 * | 5/2018 | Chen | H01L 21/4857 |
| 2020/0111681 A1 * | 4/2020 | Suk | H01L 25/50 |
| 2020/0176432 A1 * | 6/2020 | Huang | H01L 25/18 |
| 2020/0266143 A1 * | 8/2020 | Liao | H01L 23/50 |
| 2020/0273804 A1 | 8/2020 | Jeon et al. | |

FOREIGN PATENT DOCUMENTS

| | | |
|---|---|---|
| KR | 101570274 B1 | 11/2015 |
| KR | 101830904 B1 | 2/2018 |
| KR | 10-2021-0096497 A | 8/2021 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0041333, filed on Apr. 1, 2022, in the Korean Intellectual Property Office, the disclosure of which is incorporated by reference herein in its entirety.

BACKGROUND

The inventive concepts relate to semiconductor packages, and more particularly, to fan-out semiconductor packages.

Due to the rapid development in the electronics industry and user demands, electronic devices have smaller sizes, more functions, and larger capacities. Accordingly, highly integrated semiconductor chips are required.

Therefore, for highly integrated semiconductor chips including a greater number of input/output connection terminals, semiconductor packages having connection terminals with reliability connection are being devised.

SUMMARY

In some example embodiments, to reduce, minimize, or prevent interference between connection terminals in semiconductor packages, fan-out semiconductor packages with increased intervals between connection terminals are provided.

Some example embodiments of the inventive concepts provide a semiconductor package in which the reliability in electrical connection is improved.

According to some example embodiments of the inventive concepts, a semiconductor package may include a lower redistribution layer including a lower redistribution layer including a plurality of lower redistribution line patterns, a plurality of lower redistribution via patterns, and a lower redistribution insulating layer surrounding the plurality of lower redistribution line patterns and the plurality of lower redistribution via patterns, an expanded layer including one or more surfaces at least partially defining a mounting space, and a semiconductor chip in the mounting space, on the lower redistribution layer. The expanded layer may include, on the lower redistribution layer, a via pad, an expanded structure covering the via pad, and an extending via portion connected with the via pad through the expanded structure. The via pad may include one or more surfaces at least partially defining a via pad recess extending from a bottom surface of the via pad into the via pad. From among the plurality of lower redistribution via patterns, one lower redistribution via pattern connected with the via pad may extend into the via pad while filling the via pad recess, to thereby electrically connect the via pad with one lower redistribution line pattern of the plurality of lower redistribution line patterns. A bottom surface of a portion of the one lower redistribution line pattern that is connected with the via pad may be planar.

According to some example embodiments of the inventive concepts, a semiconductor package may include a lower redistribution layer including a plurality of lower redistribution line patterns, a plurality of lower redistribution via patterns, and a lower redistribution insulating layer surrounding the plurality of lower redistribution line patterns and the plurality of lower redistribution via patterns, a semiconductor chip in a chip region on the lower redistribution layer and including a chip connection pad facing the lower redistribution layer, and an expanded layer in a connection region surrounding the chip region on the lower redistribution layer, the expanded layer including a via pad, an expanded structure covering the via pad, an extending via portion penetrating the expanded structure and connected with the via pad, and one or more surfaces at least partially defining a mounting space in which the semiconductor chip is located. Each lower redistribution via pattern of the plurality of lower redistribution via patterns may connect a separate first lower redistribution line pattern of the plurality of lower redistribution line patterns at a lower position of the lower redistribution via pattern with a particular element of a plurality of particular elements at an upper position of the lower redistribution via pattern. The particular element may be one of the via pad, the chip connection pad, or a second lower redistribution line pattern of the plurality of lower redistribution line patterns. Separate, respective particular elements of the plurality of particular elements to which the plurality of lower redistribution via patterns are connected at respective upper positions may have separate, respective bottom surfaces and at least partially define a separate, respective bottom surface recesses extending inward into the separate, respective particular elements from the separate, respective bottom surfaces. A separate bottom surface of a portion of each separate first lower redistribution line pattern may be planar.

According to some example embodiments of the inventive concepts, a semiconductor package may include a lower redistribution layer including a plurality of lower redistribution line patterns, a plurality of lower redistribution via patterns each having a tapered shape extending with a horizontal width decreasing in a bottom-up manner and to which any one of the plurality of lower redistribution line patterns are connected underneath, and a lower redistribution insulating layer surrounding the plurality of lower redistribution line patterns and the plurality of lower redistribution via patterns, a semiconductor chip in a chip region on the lower redistribution layer and including a chip connection pad facing the lower redistribution layer, an expanded layer in a connection region surrounding the chip region on the lower redistribution layer, the expanded layer including a via pad, an expanded structure covering the via pad, and a via connection pad portion on a top surface of the expanded structure, an extended via portion connecting the via pad and the via connection pad portion through the expanded structure, the expanded layer including one or more surfaces at partially defining a mounting space in which the semiconductor chip is arranged, the via pad at least partially defining a via pad recess extending from a bottom surface of the via pad into the via pad, a cover insulating layer filling a space defined between the semiconductor chip and the expanding structure, an upper redistribution conductive structure including a plurality of upper redistribution line patterns and a plurality of upper redistribution via patterns and electrically connected with the via connection pad portion; an upper redistribution insulating layer surrounding the plurality of upper redistribution line patterns and the plurality of upper redistribution via patterns; and an upper redistribution layer on the cover insulating layer. The via pad may be connected with one of the plurality of lower redistribution line patterns through a lower redistribution via pattern extending into the via pad while filling the via pad recess, from among the plurality of lower redistribution via patterns, A bottom surface of a portion of the lower redistribution line pattern connected with the via pad from among the plurality of lower redistribution line patterns may be planar.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1A:
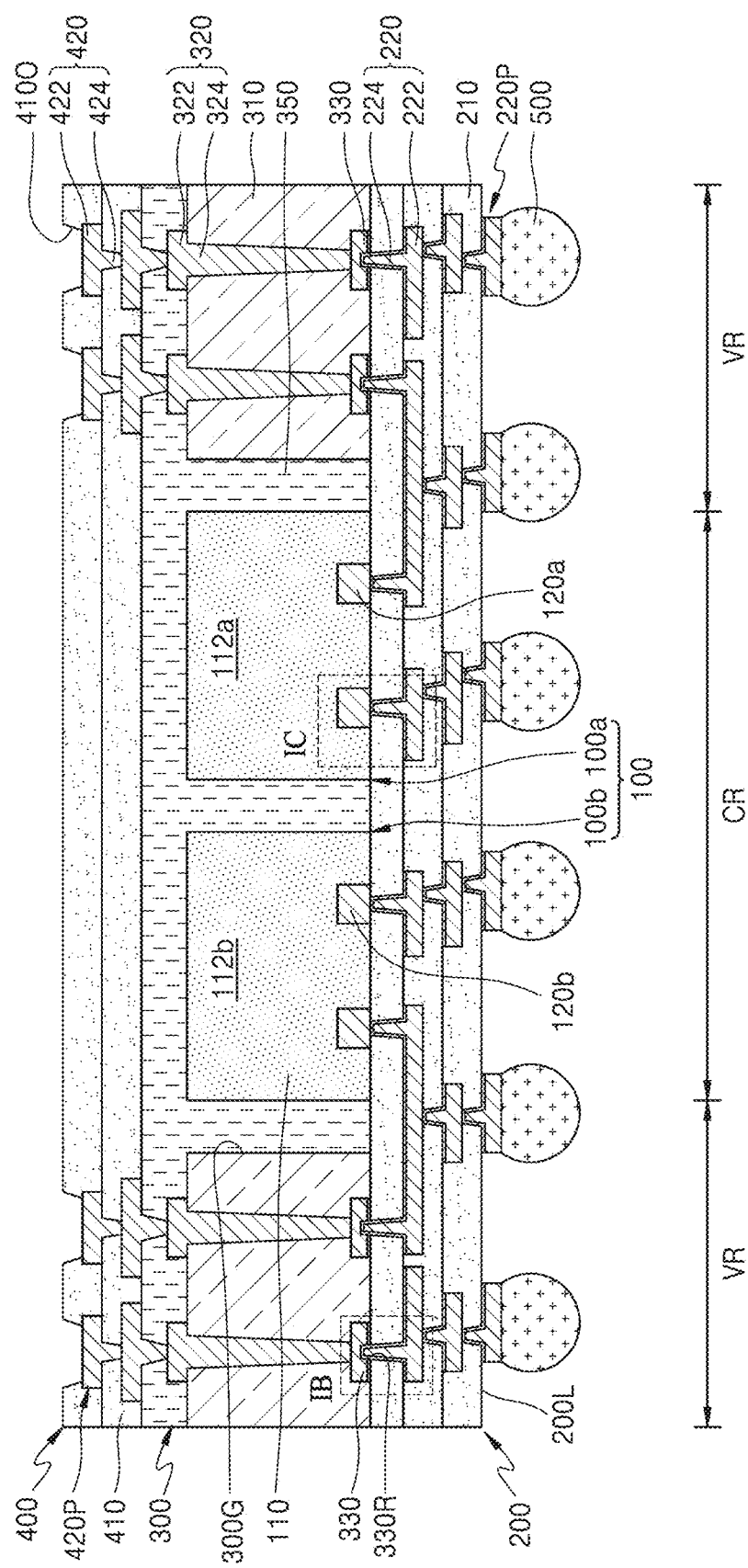
FIGS. 1A, 1B, and 1C are cross-sectional views of a semiconductor package according to some example embodiments.

Hereinafter, some example embodiments will be described in detail with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

Figure 1B:
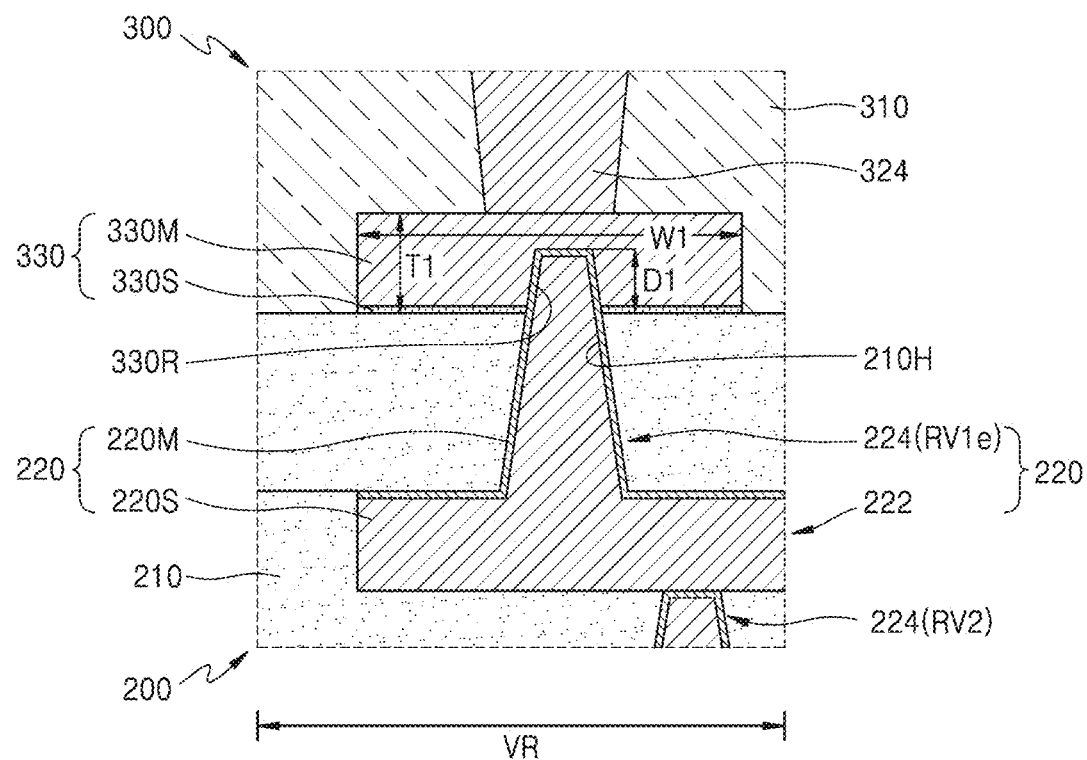
Figure 1C:
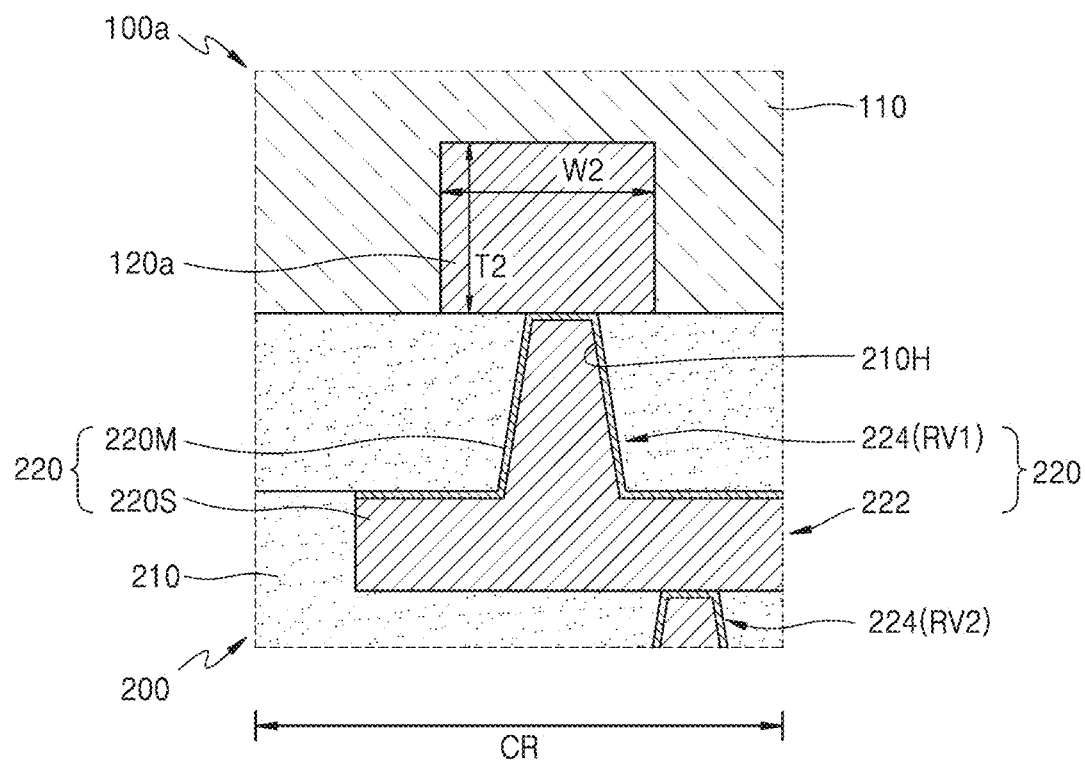

FIGS. 1A, 1B, and 1C are cross-sectional views of a semiconductor package according to some example embodiments. More particularly, FIGS. 1B and 1C are enlarged cross-sectional views of portions IB and IC shown in FIG. 1A, respectively.

Referring to FIGS. 1A to 1C, a semiconductor package 10 may include a lower redistribution layer 200, an expanded layer 300 arranged on the lower redistribution layer 200 and having (e.g., including one or more surfaces at least partially defining) a mounting space 300G, and at least one semiconductor chip 100 arranged in the mounting space 300G. In some example embodiments, the semiconductor package 10 may include a lower package of Package-on-Package (PoP).

The expanded layer 300 may surround the at least one semiconductor chip 100. The semiconductor package 10 may include a chip region CR and a connection region VR around the chip region CR. For example, the connection region VR may surround the chip region CR. The at least one semiconductor chip 100 may be in the chip region CR, and an expanded structure 310 and a via structure 320, which are included in the expanded layer 300, may be in the connection region VR.

The semiconductor package 10 may include a fan-out semiconductor package. In some example embodiments, the expanded layer 300 may include a panel board, and the semiconductor package 10 may include a fan-out panel-level package (FOPLP). In some example embodiments, a horizontal width and a horizontal area of the mounting space 300G may be greater than a horizontal width and a horizontal area of the semiconductor chip 100. A side surface of the semiconductor chip 100 may be apart from (e.g., isolated from direct contact with) an inner side surface of the expanded structure 310 at least partially defining a side of the mounting space 300G.

In some example embodiments, the semiconductor package 10 may include two or more semiconductor chips 100 arranged in in the chip region CR, for example, a first semiconductor chip 100a and a second semiconductor chip 100b. In some example embodiments, the first semiconductor chip 100a and the second semiconductor chip 100b may be apart from each other in a horizontal direction on the lower redistribution layer 200. The horizontal width and horizontal area of the mounting space 300G may be greater than a horizontal width and horizontal area of a footprint occupied by the first semiconductor chip 100a and the second semiconductor chip 100b. A side surface of each of the first semiconductor chip 100a and the second semiconductor chip 100b may be apart from the inner side surface of the mounting space 300G. For example, the chip region CR of the semiconductor package 10 may include a portion of the semiconductor package 10 overlapping in the vertical direction (e.g., a direction extending perpendicular to the bottom surface 200L of the lower redistribution layer 200) with the footprint occupied by the first semiconductor chip 100a and the second semiconductor chip 100b, and the connection region VR may include a remaining portion of the semiconductor package 10 that does not overlap in the vertical direction with (e.g., is exposed in the vertical direction by) the footprint occupied by the first semiconductor chip 100a and the second semiconductor chip 100b.

Throughout the present specification, the semiconductor package 10 is described as including the semiconductor chip 100 or including the first semiconductor chip 100a and the second semiconductor chip 100b. However, the descriptions are merely examples, and the inventive concepts are not limited thereto. For example, the semiconductor package 10 may include one or at least two semiconductor chips, and the number of semiconductor chips included in the semiconductor package 10 is not limited.

Each of the first semiconductor chip 100a and the second semiconductor chip 100b may include a semiconductor substrate 110. The first semiconductor chip 100a may include a first semiconductor device 112a arranged on an active surface of the semiconductor substrate 110 and a plurality of first chip connection pads 120a arranged on the active surface of the semiconductor substrate 110; and the second semiconductor chip 100b may include a second semiconductor device 112b arranged on the active surface of the semiconductor substrate 110 and a plurality of second chip connection pads 120b arranged on the active surface of the semiconductor substrate 110. The semiconductor substrate 110 included in the first semiconductor chip 100a and the active surface of the semiconductor substrate 110 may be named as a first semiconductor substrate and a first active surface, respectively; and the semiconductor substrate 110 included in the second semiconductor chip 100b and the active surface of the semiconductor substrate 110 may be named as a second semiconductor substrate and a second active surface, respectively. When the first semiconductor chip 100a and the second semiconductor chip 100b are collectively named as the semiconductor chip 100, the first semiconductor device 112a and the second semiconductor device 112b may also be named as the semiconductor devices, and the first chip connection pad 120a and the second chip connection pad 120b may also be named as the chip connection pads.

The first semiconductor chip 100a and the second semiconductor chip 100b may be arranged on the lower redistribution layer 200, such that the active surfaces of the semiconductor substrates 110 face the lower redistribution layer 200. For example, the first semiconductor chip 100a may be arranged on the lower redistribution layer 200 such that the first chip connection pads 120a face the lower redistribution layer 200; and the second semiconductor chip 100b may be arranged on the lower redistribution layer 200 such that the second chip connection pads 120b face the lower redistribution layer 200.

The first semiconductor chip 100a may include the first semiconductor device 112a arranged on the active surface of the semiconductor substrate 110 and the plurality of first chip connection pads 120a arranged on the active surface of the semiconductor substrate 110; and the second semiconductor chip 100b may include the second semiconductor device 112b arranged on the active surface of the semiconductor substrate 110 and the plurality of second chip connection pads 120b arranged on the active surface of the semiconductor substrate 110. The semiconductor substrate 110 included in the first semiconductor chip 100a and the active surface of the semiconductor substrate 110 may be named as the first semiconductor substrate and the first active surface, respectively; and the semiconductor substrate 110 included in the second semiconductor chip 100b and the active surface of the semiconductor substrate 110 may be named as the second semiconductor substrate and the second active surface, respectively. When the first semiconductor chip 100a and the second semiconductor chip 100b are collectively named as the semiconductor chip 100, the first semiconductor device 112a and the second semiconductor device 112b may also be named as the semiconductor device, and the first chip connection pad 120a and the second chip connection pad 120b may also be named as the chip connection pad.

The semiconductor substrate 110 may include, for example, a semiconductor material such as silicon (Si). Alternatively, the semiconductor substrate 110 may include a semiconductor element such as germanium (Ge) or a compound semiconductor such as silicon carbide (SiC), gallium arsenide (GaAs), indium arsenide (InAs), and indium phosphide (InP). The semiconductor substrate 110 may include a conductive region, for example, a well doped with impurities. The semiconductor substrate 110 may have various device isolation structures such as a shallow trench isolation (STI) structure.

Semiconductor devices including a plurality of various individual devices, for example, the first semiconductor device 112a or the second semiconductor device 112b, may be formed on the active surface of the semiconductor substrate 110. The plurality of individual devices may include various kinds of microelectronic devices, for example, a metal-oxide-semiconductor field effect transistor (MOSFET) such as a complementary metal-insulator-semiconductor (CMOS) transistor, system large scale integration (LSI), an image sensor such as a CMOS imaging sensor (CIS), a micro-electro-mechanical system (MEMS), an active device, a passive device, and the like. The plurality of individual devices may be electrically connected with the conductive region of the semiconductor substrate 110. The first semiconductor device 112a and the second semiconductor device 112b may each include a conductive wiring or conductive plug configured to electrically connect at least two of the plurality of individual devices or electrically connect the plurality of individual devices and the conductive region of the semiconductor substrate 110. In addition, each of the plurality of individual devices may be electrically isolated from adjacent individual devices by insulating films.

The semiconductor chip 100 may include, for example, a processor chip, a power management integrated circuit (PMIC) chip, or a memory chip. The processor chip may include a central processing unit (CPU) chip, a graphic processing unit (GPU) chip, or an application processor (AP) chip. The memory chip may include a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. In some example embodiments, the first semiconductor chip 100a may include a processor chip, and the second semiconductor chip 100b may include a PMIC chip. In other embodiments, the first semiconductor chip 100a may include a processor chip, and the second semiconductor chip 100b may include a memory chip.

In some example embodiments, the first chip connection pads 120a and the second chip connection pads 120b may each include aluminum (Al) or alloys including Al.

The lower redistribution layer 200 may include at least one lower redistribution insulating layer 210 and a lower redistribution conductive structure 220. The at least one lower redistribution insulating layer 210 may surround at least a portion of the lower redistribution conductive structure 220. The lower redistribution conductive structure 220 may include: a plurality of lower redistribution line patterns 222 arranged on at least one of a top surface and a bottom surface of the at least one lower redistribution insulating layer 210; and a plurality of lower redistribution via patterns 224 each being in contact and connection with a portion of the lower redistribution line patterns 222 through at least a portion of the at least one lower redistribution insulating layer 210, for example extending through a hole, trench, or the like 210H extending through a thickness of at least one lower redistribution insulating layer 210. The lower redistribution conductive structure 220 may connect the via pad 330 and an external connection terminal 500.

The lower redistribution line patterns 222 may be at two or more different vertical levels to form a plurality of wiring layers. In the present specification, the wiring layer indicates a layer having a circuit wiring forming electrical paths on a same plane. In the present specification, the wiring layer indicates a region in which some of the lower redistribution line patterns 222 are arranged on a same plane to form electrical paths, and a plurality of wiring layers indicate regions in which some of the lower redistribution line patterns 222 are differently arranged on planes at different vertical levels, to thereby respectively form electrical paths. The lower redistribution via patterns 224 may electrically connect the lower redistribution line patterns 222 respectively arranged on different wiring layers, or may electrically connect the lower redistribution line pattern 222 and the via pad 330.

In the present specification, the term 'level', 'vertical level', 'depth', 'height', or the like may mean a vertical height (e.g., vertical distance) measured from a reference location (e.g., the bottom surface 200L of the lower redistribution layer 200) in a direction perpendicular to the plane or surface at the reference location (e.g., a direction perpendicular to bottom surface 200L of the lower redistribution layer 200). For example, where a vertical level of a first element is described herein to be lower than a vertical level of a second element, it will be understood that the distance of the first element from the reference location in the vertical direction may be smaller than the distance of the second element from the reference location in the vertical direction.

The lower redistribution line pattern 222 and the lower redistribution via pattern 224 may include, but are not limited to, metals such as copper (Cu), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), and alloys thereof.

At least some of the lower redistribution line patterns 222 may be integrally formed with some of the lower redistribution via patterns 224. For example, at least some of the lower redistribution line patterns 222 may be integrally formed with some of the lower redistribution via patterns 224 being in contact with tops of some of the lower redistribution line patterns 222.

In some example embodiments, the lower redistribution via patterns may have a tapered shape extending with a horizontal width (e.g., a width in a horizontal direction which may be a direction extending parallel to the bottom surface 200L of the lower redistribution layer 200) decreasing in a bottom-up manner (e.g., the width of the lower redistribution via patterns decreasing with increasing distance in the vertical direction from the bottom surface 200L of the lower redistribution layer 200 in the vertical direction, the width of the lower redistribution via patterns being inversely proportional to distance in the vertical direction from the bottom surface 200L of the lower redistribution layer 200 in the vertical direction, etc.). For example, the horizontal width of the lower redistribution via patterns 224 may increase away from the semiconductor chip 100. In some example embodiments, the horizontal width of the lower redistribution via patterns 224 may decrease away from the lower redistribution line patterns 222 integral with the lower redistribution via pattern 224 from among the lower redistribution line patterns 222.

The at least one lower redistribution insulating layer 210 may include, for example, a material film including organic compounds. In some example embodiments, the at least one lower redistribution insulating layer 210 may include a material film including organic polymer materials. In some example embodiments, the at least one lower redistribution insulating layer 210 may be formed from photosensitive polyimide (PSPI).

The lower redistribution conductive structure 220 may include a lower redistribution seed layer 220S and a lower redistribution conductive layer 220M. For example, the lower redistribution conductive structure 220 may have a stack structure including the lower redistribution seed layer 220S and the lower redistribution conductive layer 220M. For example, the lower redistribution seed layer 220S may be formed by physical vapor deposition method, and the lower redistribution conductive layer 220M may be formed through a plating process in which the lower redistribution seed layer 220S is used as the seed.

The lower redistribution seed layer 220S may be between the lower redistribution conductive layer 220M and the lower redistribution insulating layer 210, between the lower redistribution conductive layer 220M and the via pad 330, between the lower redistribution conductive layer 220M and the first chip connection pad 120a, and between the lower redistribution conductive layer 220M and the second chip connection pad 120b. Each of the lower redistribution line patterns 222 and the lower redistribution via patterns 224 may have a stack structure including a portion of the lower redistribution seed layer 220S and a portion of the lower redistribution conductive layer 220M. For example, the lower redistribution seed layer 220S may cover a top surface of a portion of the lower redistribution conductive layer 220M included in the lower redistribution line pattern 222, and side surfaces and a top surface of a portion of the lower redistribution conductive layer 220M included in the lower redistribution via pattern 224.

The lower redistribution seed layer 220S may include, for example, a material selected from a group consisting of copper (Cu), titanium (Ti), titanium tungsten (TiW), titanium nitride (TiN), tantalum (Ta), tantalum nitride (TaN), chromium (Cr), and the like. However, the material of the lower redistribution seed layer 220S is not limited to the aforementioned materials. In some example embodiments, the lower redistribution seed layer 220S may have a Cu/Ti structure, in which copper is stacked on titanium, or a Cu/TiW structure in which copper is stacked on titanium tungsten. The lower redistribution conductive layer 220M may include, but is not limited to, Cu or alloys including Cu. In some example embodiments, at least a portion of the lower redistribution seed layer 220S may function as a diffusion barrier layer against atoms of the material included in the lower redistribution conductive layer 220M.

The first chip connection pads 120a of the first semiconductor chip 100a and the second chip connection pads 120b of the second semiconductor chip 100b may be electrically connected with the lower redistribution conductive structure 220. In some example embodiments, from among the lower redistribution via patterns 224, some of the lower redistribution via patterns 224 arranged at a topmost end of the lower redistribution layer 200 (also referred to herein as a set of lower redistribution via patterns 224) may contact the first chip connection pads 120a and the second chip connection pads 120b, and others (e.g., other one or more lower redistribution via patterns 224) may contact the via pads 330. A plurality of the external connection terminals 500 electrically connected with the lower redistribution conductive structures 220 may be attached to bottom of the lower redistribution layer 200. In some example embodiments, from among the lower redistribution line patterns 222, some of the lower redistribution line patterns 222 arranged at a bottommost end of the lower redistribution layer 200 (e.g., an end in closest proximity to the bottom surface 200L of the lower redistribution layer 200 in the vertical direction) may include a plurality of terminal connection pads 220P to which the external connection terminals 500 are attached.

The expanded layer 300 may include the expanded structure 310, a via structure 320, and the via pad 330. The via pad 330 may be arranged on the lower redistribution layer 200, the expanded structure 310 may cover the via pad 330 on the lower redistribution layer 200, and the via structure 320 may be connected with the via pad 330 through the expanded structure 310.

The expanded structure 310 may include a printed circuit board (PCB), a ceramic substrate, a wafer for manufacturing packages, an interposer, or a molding layer including a molding material. In some example embodiments, the expanded layer 300 may include a multi-layer printed circuit board. The mounting space 300G may be formed into an opening or a cavity in the expanded layer 300. The mounting space 300G may be formed in some region, for example, a central region of the expanded layer 300. The mounting space 300G may be recessed or open from the top surface of the expanded layer 300 to a certain depth. A dry etching, wet etching, screen printing, drill bit, or laser drilling process may be used to recess or open the expanded layer 300.

The expanded structure 310 may include at least one material selected from among phenol resin, epoxy resin, and polyimide. The expanded structure 310 may, for example, include at least one material selected from Frame Retardant 4 (FR-4), tetrafunctional epoxy, polyphenylene ether, epoxy/polyphenylene oxide, bismaleimide triazine (BT), thermount, cyanate ester, polyimide, and liquid crystal polymer, or may include an epoxy mold compound (EMC).

The via structure 320 may include a via connection pad portion 322 and an extended via portion 324. The via connection pad portion 322 may be arranged on a top surface of the expanded structure 310, and the extended via portion 324 may connect the via connection pad portion 322 to the via pad 330 through the expanded structure 310. In some example embodiments, a bottommost surface of the via pad 330 (e.g., a surface that is in closest proximity to the bottom surface 200L of the lower redistribution layer 200 in the vertical direction) and a bottom surface of the expanded structure 310 may be at a same vertical level (e.g., a same distance from the bottom surface 200L of the lower redistribution layer 200 in the vertical direction) and coplanar with each other. For example, the via pad 330 may be buried in the expanded structure 310. The via structure 320 and the via pad 330 may include Cu or an alloy including Cu. In some example embodiments, the via pad 330 may include a material different from those of the first chip connection pad 120a and the second chip connection pad 120b.

The via pad 330 may include a via pad seed layer 330S and a via pad conductive layer 330M. For example, the via pad 330 may have a stack structure including the via pad seed layer 330S and the via pad conductive layer 330M. For example, the via pad seed layer 330S may be formed by performing physical vapor deposition, and the via pad conductive layer 330M may be formed through a plating process in which the via pad seed layer 330S is used as a seed. The via pad seed layer 330S may be between the via pad conductive layer 330M and the lower redistribution insulating layer 210.

The via pad seed layer 330S may include a material selected from a group consisting of Cu, Ti, TiW, TiN, Ta, TaN, Cr, and the like. However, the material included in the via pad seed layer 330S is not limited to the aforementioned materials. In some example embodiments, the via pad seed layer 330S may have a Cu/Ti structure, in which Cu is stacked on Ti, or a Cu/TiW structure in which Cu is stacked on TiW. The via pad conductive layer 330M may include, but is not limited to, Cu or alloys including Cu.

The via pad 330 may have a first horizontal width W1 and a first thickness T1. For example, the first horizontal width W1 may be from about 200 μm to about 300 μm, and the first thickness T1 may be from about 10 μm to about 20 μm. The via pad 330 may have (e.g., may have one or more surfaces at least partially defining, may at least partially define, etc.) a via pad recess 330R extending inward from a bottom surface of the via pad 330. The via pad recess 330R may extend into the via pad conductive layer 330M through the via pad seed layer 330S. The via pad recess 330R extend into the via pad 330 with a first depth D1 from the bottom surface of the via pad 330. The first depth D1 may be smaller than the first thickness T1. In some example embodiments, a value of the first depth D1 may be from about 10% to about 80% of a value of the first thickness T1. For example, the first depth D1 may be from about 1 μm to about 16 μm. In some example embodiments, a top surface of the via pad 330 may be even. For example, the top surface of the via pad 330, which is opposite to the bottom surface of the via pad 330 in which the via pad recess 330R is located, may be even without steps. As described herein, a surface that is described to be "even" may be interchangeably described as being "planar," for example entirely (e.g., completely) planar. An even, or planar, surface as described herein may extend in parallel with one or more layers, surfaces, or the like of the semiconductor package 10. For example, an even, or planar, surface as described herein may extend in parallel with the lower redistribution layer 200, for example in parallel with the bottom surface 200L of the lower redistribution layer 200.

The first chip connection pads 120a and the second chip connection pads 120b may each have a second horizontal width W2 and a second thickness T2. In some example embodiments, the second horizontal width W2 may be smaller than the first horizontal width W1, and the second thickness T2 may be greater than the first thickness T1. For example, the second horizontal width W2 may be from about 50 μm to about 100 μm, and the second thickness T2 may be from about 100 μm to about 300 μm.

From among the lower redistribution via patterns 224, the lower redistribution via pattern 224 connected with the via pad 330 (e.g., one lower redistribution via pattern 224 that is connected with the via pad 330) may extend into the via pad 330 while filling the via pad recess 330R. The lower redistribution via pattern 224 (e.g., the one lower redistribution via pattern 224), which extends into the via pad recess 330R while filling the via pad recess 330R, may be between the via pad 330 and the lower redistribution line pattern 222 (e.g., one lower redistribution line pattern 222 of the plurality of lower redistribution line patterns) to electrically connect the via pad 330 and the lower redistribution line pattern 222. A portion of the lower redistribution line pattern 222 connected with the via pad 330 (e.g., the one lower redistribution line pattern 222), with the lower redistribution via pattern 224 (e.g., the one lower redistribution via pattern 224) therebetween, may have a bottom surface that is even without steps (e.g., is entirely planar). For example, in the lower redistribution line pattern 222 connected with the via pad 330 with the lower redistribution via pattern 224 therebetween, a portion overlapping in the vertical direction with the via pad recess 330R or the lower redistribution via pattern 224 may have a bottom surface that is even without steps.

From among the lower redistribution via patterns 224, each of the lower redistribution via patterns 224 arranged at a topmost end of the lower redistribution layer 200 may be named as first via patterns RV1 and RV1e, respectively, and from among the lower redistribution via patterns 224, each of remaining lower redistribution via patterns 224 except the first via patterns RV1 and RV1e may be named as second via pattern RV2.

The first via patterns RV1 and RV1e may be connected with any one of the first chip connection pad 120a, the second chip connection pad 120b, and the via pad 330 on the first via pattern RV1 and RV1e, and the second via pattern RV2 may be connected with any one lower redistribution line pattern 222 on the second via pattern RV2 from among the lower redistribution line patterns 222.

From between the first via patterns RV1 and RV1e, a via pattern further extending upward from the top surface of the lower redistribution insulating layer 210 to a vertical level higher than the top surface of the lower redistribution insulating layer 210 may be named as first extending via pattern RV1e, and a remaining one may be named as a first basic via pattern RV1. The second via pattern RV2 may be named as a second basic via pattern RV2.

The first basic via pattern RV1 may be in the chip region CR, and the first extending via pattern RV1e may be in the connection region VR. A top surface of the first basic via pattern Rv1 may be at a same vertical level as the top surface of the lower redistribution insulating layer 210. A length of extension of the first extending via pattern RV1e, that is, the height of the first extending via pattern RV1e, may be greater than a height of the first basic via pattern RV1.

The first extending via pattern RV1e may extend into the via pad 330 while filling the via pad recess 330R. A portion of the lower redistribution line pattern 222 connected with the first extending via pattern RV1e and overlapping in the vertical direction with the first extending via pattern RV1e may have a bottom surface that is even without steps. The first extending via pattern RV1e may extend into the via pad conductive layer 330M through the via pad seed layer 330S, and therefore, a topmost end of the first extending via pattern RV1e may contact the via pad conductive layer 330M. A portion of the lower redistribution seed layer 220S included in the first extending via patter RV1e may cover an entire portion of an inner surface of the via pad recess 330R. For example, a portion of the lower redistribution seed layer 220S included in the first extending via pattern RV 1e may cover both the via pad seed layer 330S and the via pad conductive layer 330M exposed to the via pad recess 330R.

The top surface of the first extending via pattern RV1e may be at a vertical level higher than each of the bottom surface of the first chip connection pad 120a, the bottom surface of the second chip connection pad 120b, a bottommost surface of the via pad 330, a bottom surface of the expanded structure 310, and the bottom surface of the cover insulating layer 350. The top surface of the first extending via pattern RV1e may be at a vertical level higher than the top surface of the first basic via pattern RV1.

The top surface of the first basic via pattern RV1 may contact a bottom surface of any one of the first chip connection pads 120a and the second chip connection pads 120b. Each of the first chip connection pads 120a and the second chip connection pads 120b connected with the first basic via pattern RV1 may have an even bottom surface. In some example embodiments, the top surface of the first basic via pattern RV1 may be at a same vertical level as the bottom surfaces of the first chip connection pads 120a and the second chip connection pads 120b. Accordingly, the top surface of the first basic via pattern RV1 may be at a same vertical level as each of the bottom surface of the first chip connection pad 120a, the bottom surface of the second chip connection pad 120b, the bottommost surface of the via pad 330, and the bottom surface of the expanded structure 310, and the bottom surface of the cover insulating layer 350.

A top surface of the second via pattern RV2 may contact a bottom surface of the lower redistribution line pattern 222 connected with the second via pattern RV2 on the second via pattern RV2. The bottom surface of the lower redistribution line pattern 222 connected with the via pattern RV2 on the second via pattern RV2 may be even. In some example embodiments, the top surface of the second via pattern RV2 may be at a same vertical level as the bottom surface of the lower redistribution line pattern 222 connected with the second via pattern RV2 on the second via pattern RV2.

In some example embodiments, the expanded structure 310 may include a multi-layered substrate including a plurality of layers. When the expanded structure 310 includes a plurality of layers, the expanded layer 300 may include a plurality of the via structures 320 corresponding to the plurality of layers included in the expanded structure 310. For example, the plurality of via structures 320 may be vertically stacked through each of the plurality of layers included in the expanded structure 310.

The semiconductor package 10 may further include the cover insulating layer 350 filling the mounting space 300G. The cover insulating layer 350 may fill a space between the semiconductor chip 100 and the expanded structure 310. The cover insulating layer 350 may fill the space between the semiconductor chip 100 and the expanded structure 310, and may cover top surfaces of the semiconductor chip 100 and the expanded layer 300. For example, the cover insulating layer 350 may include a thermosetting resin such as epoxy resin, a thermoplastic resin such as polyimide, or a resin including a reinforcing material such as an inorganic filler in addition to the thermosetting resin or thermoplastic resin, more particularly, Ajinomoto Build-up Film (ABF), FR-4, BT, and the like. Alternatively, the cover insulating layer 350 may include a molding material such as EMC or a photosensitive material such as photoimageable encapsulant (PIE). In some example embodiments, a portion of the cover insulating layer 350 may include an insulating material such as a silicon oxide film, a silicon nitride film, or a silicon oxynitride film.

In some example embodiments, a bottom surface of the at least one semiconductor chip 100, the bottom surface of the expanded structure 310, and the bottom surface of the cover insulating layer 350 may be at a same vertical level and coplanar with one another. For example, the top surface of the lower redistribution insulating layer 210, a bottommost surface of the first chip connection pad 120a, a bottommost surface of the second chip connection pad 120b, the bottommost surface of the via pad 330, the bottom surface of the expanded structure 310, and the bottom surface of the cover insulating layer 350 may be at a same vertical level.

The semiconductor package 10 may further include an upper redistribution layer 400 on the cover insulating layer 350. The upper redistribution layer 400 may include at least one upper redistribution insulating layer 410 and an upper redistribution conductive structure 420. The upper redistribution conductive structure 420 may include: a plurality of upper redistribution line patterns 422 arranged on at least one of a top surface and a bottom surface of the at least one upper redistribution insulating layer 410; and a plurality of upper redistribution via patterns 424 each being in contact and connection with a portion of the upper redistribution line patterns 422 through at least a portion of the at least one upper redistribution insulating layer 410. The upper redistribution conductive structure 420 may be connected with the via connection pad portion 322 of the via structure 320.

The upper redistribution insulating layer 410 included in the upper redistribution layer 400 and the upper redistribution conductive structure 420 including the upper redistribution line patterns 422 and the upper redistribution via patterns 424 are generally similar to the lower redistribution insulating layer 210 included in the lower redistribution layer 200 and the lower redistribution conductive structure 220 including the lower redistribution line patterns 222 and the lower redistribution via patterns 224, and therefore, same descriptions thereof will be omitted.

At least some of the upper redistribution line patterns 422 may be integrally formed with some of the upper redistribution via patterns 424. For example, some of the upper redistribution line patterns 422 may be integrally formed with some of the lower redistribution via patterns 424 being in contact with bottoms of some of the upper redistribution line patterns 422.

In some example embodiments, the upper redistribution via patterns 424 may have a tapered shape extending with a horizontal width increasing in a bottom-up manner. For example, the horizontal width of the upper redistribution via patterns 424 may increase away from the semiconductor chip 100. In some example embodiments, the horizontal width of the upper redistribution via patterns 424 may decrease away from the upper redistribution line patterns 422 integral with the upper redistribution via patterns 424 from among the upper redistribution line patterns 422.

Although not shown, similar to the lower redistribution conductive structure 220, the upper redistribution conductive structure 420 may include an upper redistribution seed layer and an upper redistribution conductive layer. For example, the upper redistribution conductive structure 420 may have a stack structure including the upper redistribution seed layer and the upper redistribution conductive layer. For example, the upper redistribution seed layer may be formed by performing physical vapor deposition, and the upper redistribution conductive layer may be formed through a plating process in which the upper redistribution seed layer is used as the seed.

The upper redistribution seed layer may be between the upper redistribution conductive layer and the upper redistribution insulating layer 410 and between the upper redistribution conductive layer and the via connection pad portion 322. Each of the upper redistribution line patterns 422 and the upper redistribution via patterns 424 may have a stack structure including a portion of the upper redistribution seed layer and a portion of the upper redistribution conductive layer. In examples, the upper redistribution seed layer may cover a bottom surface of a portion of the upper redistribution conductive layer included in the upper redistribution line pattern 422, and side surfaces and a bottom surface of a portion of the upper redistribution conductive layer included in the upper redistribution via pattern 424.

From among the upper redistribution line patterns 422, an upper redistribution line pattern 422 arranged at a topmost end of the upper redistribution layer 400 may include a package connection pad 420P, which has a top surface partially exposed without being covered by the upper redistribution insulating layer 410 through an opening 410O in the upper redistribution insulating layer 410. In some example embodiments, when the semiconductor package 10 is a lower package of a package-on-package (PoP), an upper package of the PoP may be connected with the package connection pad 420P.

In the semiconductor package 10 according to the inventive concepts, from among the lower redistribution via patterns 224, a lower redistribution via pattern 224 connected with the via pad 330, that is, the first extending via pattern RV1e, extends into the via pad 330 while filling the via pad recess 330R, and thus, junction intensity between the first extending via pattern RV1e and the via pad 330 may increase.

Therefore, even when the stress is concentrated on a portion of the semiconductor package 10 in which the at least one semiconductor chip 100 is not arranged, that is, the connection region VR, a junction interface between the first extending via pattern RV1e and the via pad 330 may be not damaged, and accordingly, the reliability in electrical connection in the semiconductor package 10 may be improved.

Figure 2A:
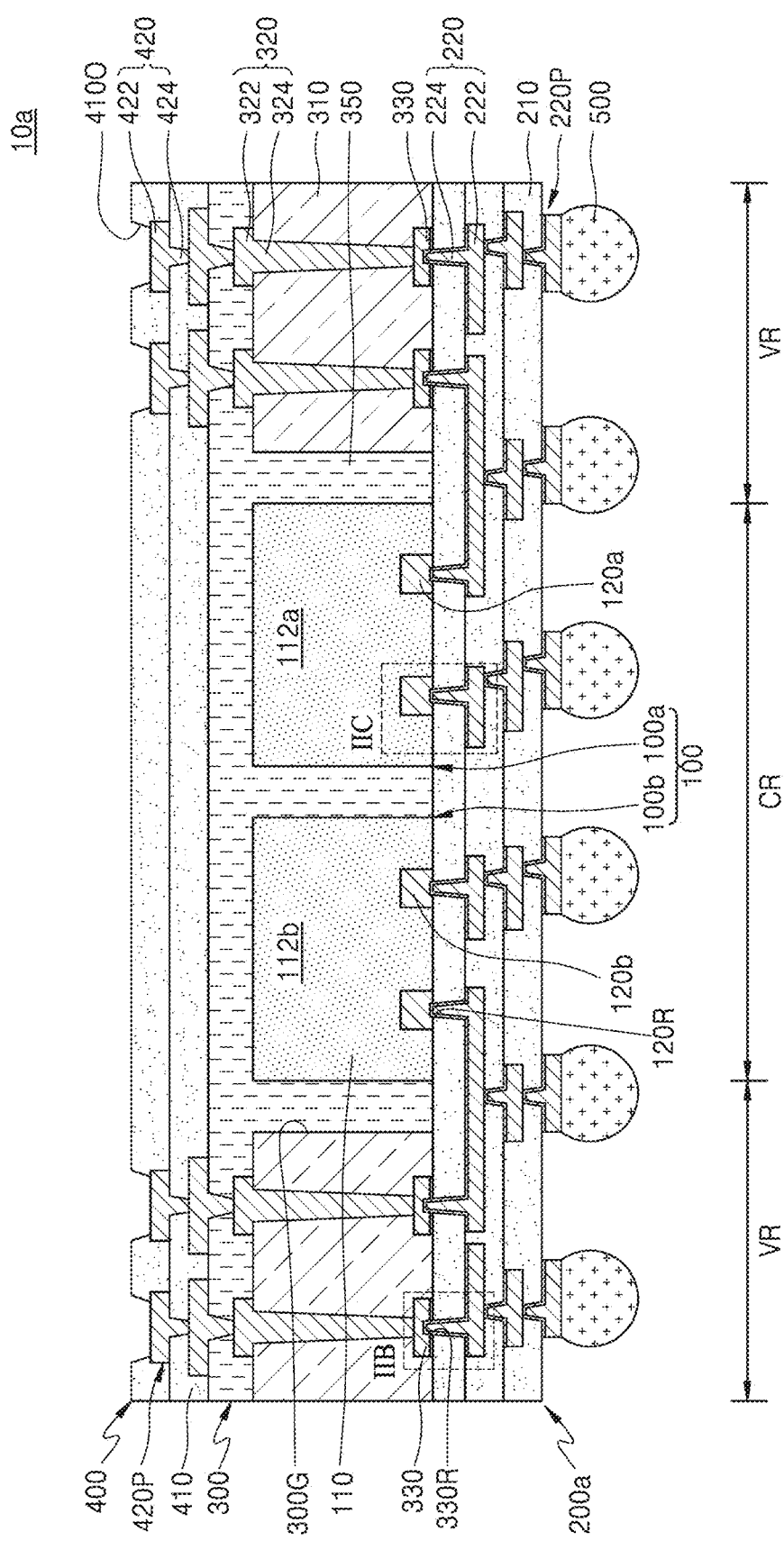
FIGS. 2A, 2B, and 2C are cross-sectional views of a semiconductor package according to some example embodiments.
Figure 2B:
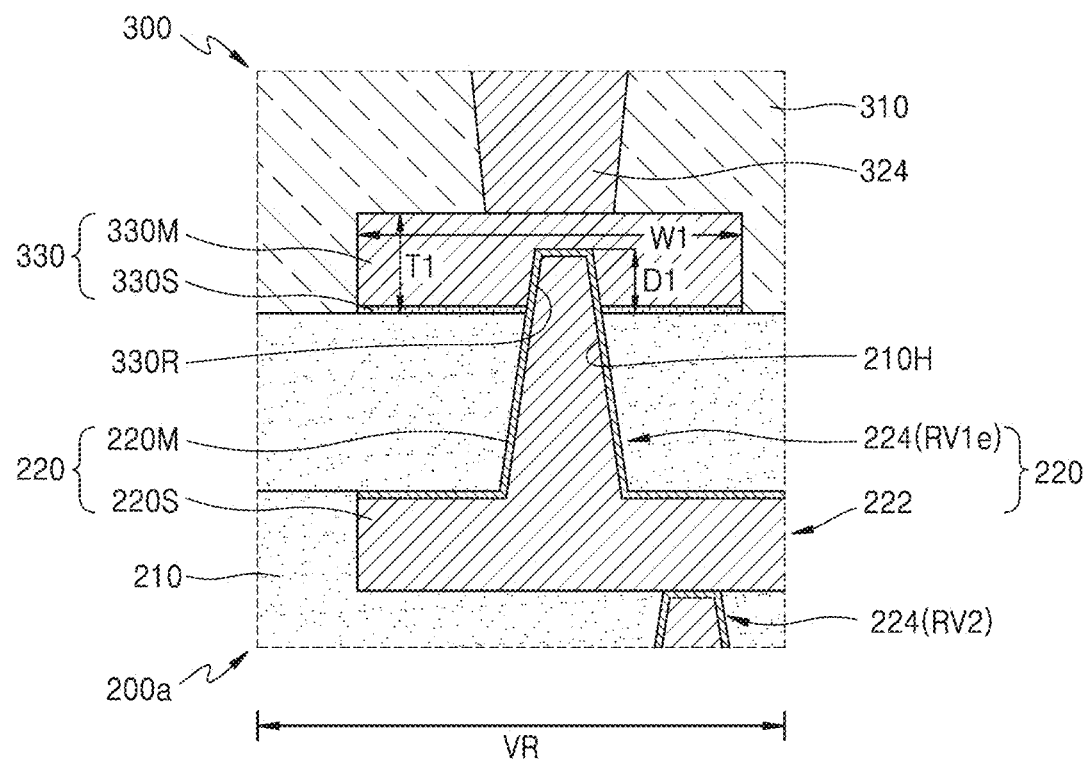
Figure 2C:
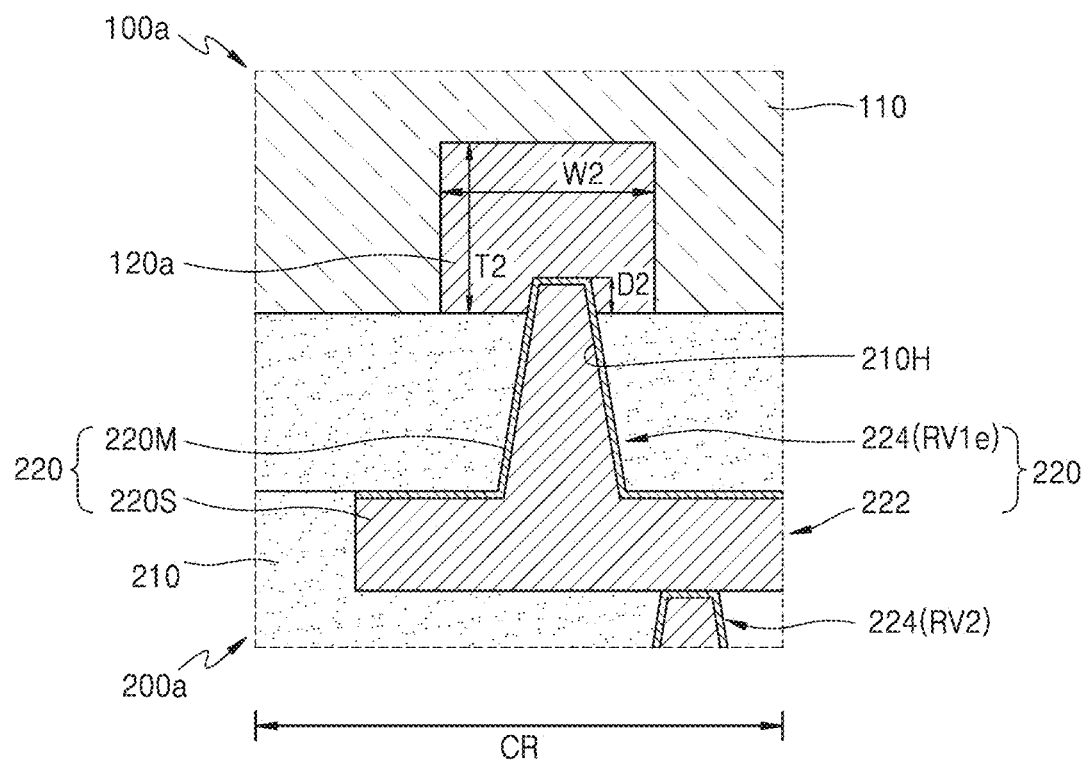

FIGS. 2A, 2B, and 2C are cross-sectional views of a semiconductor package according to some example embodiments. More particularly, FIGS. 2B and 2C are enlarged cross-sectional views of portions IIB and IIC shown in FIG. 2A, respectively. Throughout FIGS. 2A to 2C, same component names as those of FIGS. 1A to 1C indicate substantially same components or generally same components with some modification. Same reference numerals indicate substantially same components, and same descriptions as those with reference to FIGS. 1A to 1C may be omitted.

Referring to FIGS. 2A to 2C, a semiconductor package 10a may include a lower redistribution layer 200a, the expanded layer 300 arranged on the lower redistribution layer 200a and having the mounting space 300G, and the at least one semiconductor chip 100 in the mounting space 300G. In some example embodiments, the semiconductor package 10a may include a lower package of PoP.

The lower redistribution layer 200a may include the at least one lower redistribution insulating layer 210 and the lower redistribution conductive structure 220. The at least one lower redistribution insulating layer 210 may surround at least a portion of the lower redistribution conductive structure 220. The lower redistribution conductive structure 220 may include: the lower redistribution line patterns 222 arranged on at least one of the top surface and the bottom surface of the at least one lower redistribution insulating layer 210; and the lower redistribution via patterns 224 each being in contact and connection with some of the lower redistribution line patterns 222. The lower redistribution conductive structure 220 may connect the via pad 330 and the external connection terminal 500.

The via pad 330 may have the first horizontal width W1 and the first thickness T1. The via pad 330 may have the via pad recess 330R extending inward from the bottom surface of the via pad 330. The via pad recess 330R may extend into the via pad conductive layer 330M through the via pad seed layer 330S. The via pad recess 330R may extend into the via pad 330 with the first depth D1 from the bottom surface of the via pad 330. The first depth D1 may be smaller than the first thickness T1. In some example embodiments, the value of the first depth D1 may be from about 10% to about 80% of the value of the first thickness T1. For example, the first depth D1 may be from about 1 μm to about 16 μm.

The plurality of first chip connection pads 120a and the plurality of second chip connection pads 120b may each have the second horizontal width W2 and the second thickness T2. In some example embodiments, the second horizontal width W2 may be smaller than the first horizontal width W1, and the second thickness T2 may be greater than the first thickness T1. The first chip connection pads 120a and the second chip connection pads 120b may respectively have the chip pad recess 120R inward from the bottom surfaces of the first chip connection pads 120a and the second chip connection pads 120b. The chip pad recess 120R may extend into each of the first chip connection pads 120a and the second chip connection pads 120b with the second depth D2 from the bottom surfaces of the first chip connection pads 120a and the second chip connection pads 120b. The second depth D2 may have a value less than a value of the second thickness T2. For example, where the lower redistribution via patterns 224 includes a particular set of lower redistribution via patterns 224 connected with the chip connection pads (e.g., the first chip connection pads 120a and the second chip connection pads 120b), a top surface of each lower distribution via pattern 224 of the set of lower redistribution via patterns connected with the plurality of chip connection pads from among the plurality of lower redistribution via patterns may be at a vertical level lower than a top surface of a lower redistribution via pattern 224 that is connected with the via pad 330. In some example embodiments, respective top surfaces of the set of lower redistribution via patterns 224 connected with the plurality of chip connection pads from among the plurality of lower redistribution via patterns may be at a same vertical level as a top surface of the lower redistribution insulating layer 210. In some example embodiments, the value of the second depth D2 may be smaller than the value of the first depth D1. For example, the second depth D2 may be from about 0.5 µm to about 10 µm. In some example embodiments, each of the first chip connection pads 120a and the second chip connection pads 120b may have an even top surface. For example, a top surface of each of the first chip connection pads 120a and the second chip connection pads 120b, which are opposite to the bottom surfaces of the first chip connection pads 120a and the second chip connection pads 120b in which the via chip pad recess 120R are located, may be even without steps.

From among the lower redistribution via patterns 224, the lower redistribution via pattern 224 connected with the first chip connection pad 120a or the second chip connection pad 120b may extend into the first chip connection pad 120a or the second chip connection pads 120b while filling the chip pad recess 120R. A portion of the lower redistribution line pattern 222, which is connected with the first chip connection pad 120a or the second chip connection pad 120b with the lower redistribution via pattern 224 therebetween, may have a bottom surface that is even without steps. For example, in the lower redistribution line pattern 222 connected with the first chip connection pad 120a or the second chip connection pad 120b with the lower redistribution via pattern 224 therebetween, a portion overlapping in the vertical direction with the chip pad recess 120R or the lower redistribution via pattern 224 may have a bottom surface that is even without steps.

From among the lower redistribution via patterns 224, the lower redistribution via pattern 224 connected with the via pad 330 may extend into the via pad 330 while filling the via pad recess 330R. From among the lower redistribution via patterns, the lower redistribution via patterns 224 connected with the first chip connection pad 120a or the second chip connection pads 120b may extend into the first chip connection pad 120a or the second chip connection pads 120b while filling the chip pad recess 120R.

From among the lower redistribution via patterns 224, each of the lower redistribution via patterns 224 arranged at the topmost end of the lower redistribution layer 200 may be named as the first via pattern RV1e, and from among the lower redistribution via patterns 224, each of remaining lower redistribution via patterns 224 except the first via pattern RV1e may be referred to as the second via pattern RV2.

The first via pattern RV1e may be connected with any one of the first chip connection pad 120a, the second chip connection pad 120b, and the via pad 330, and the second via pattern RV2 may be connected with any one of the lower redistribution line patterns 222 on top of the second via pattern RV2 from among the lower redistribution line patterns 222.

The first via pattern RV1e, which is connected with any one of the first chip connection pad 120a, the second chip connection pad 120b, and the via pad 330 on top of the first via pattern RV1e, may further extend upward from the top surface of the lower redistribution insulating layer 210 to a vertical level higher than the bottom surface of the lower redistribution insulating layer 210, and thus may be named as the first extending via pattern RV1e. The second via pattern RV2 may be referred to as a second basic via pattern RV2.

The first extending via pattern RV1e connected with the first chip connection pad 120a or the second chip connection pad 120b on top of the first extending via pattern RV1e may be named as an extending chip via pattern, and the first extending via pattern RV1e connected with the via pad on top of the first extending via pattern RV1e may be named as an extending pad via pattern. The extending chip via pattern may extend from the top surface of the lower redistribution insulating layer 210 into the first chip connection pad 120a or the second chip connection pad 120b while filling the chip pad recess 120R, and the extending pad via pattern may extend from the top surface of the lower redistribution insulating layer 210 into the via pad 330 while filling the via pad recess 330R. As the second depth D2, which is the depth of the chip pad recess 120R, is smaller than the first depth D1 that is the depth of the via pad recess 330R, a height of the extending chip via pattern may be smaller than a height of the extending pad via pattern. The extending chip via pattern may be in the chip region CR, and the extending pad via pattern may be in the connection region VR.

In the first extending via pattern RV1e, a portion of the lower redistribution seed layer 220S included in the extending chip via pattern may cover an entire portion of an inner surface of the chip pad recess 120R. For example, in the first extending via pattern RV1e, a portion of the lower redistribution seed layer 220S included in the extending chip via pattern may cover any of the first chip connection pad 120a or the second chip connection pad 120b exposed within the chip pad recess 120R.

In the first extending via pattern RV1e, the extending pad via pattern may extend into the via pad conductive layer 330M through the via pad seed layer 330S, and a topmost end of the extending pad via pattern may contact the via pad conductive layer 330M. In the first extending via pattern RV1e, a portion of the lower redistribution seed layer 220S included in the extending pad via pattern may cover an entire portion of the inner surface of the via pad recess 330R. For example, in the first extending via pattern RV1e, the portion of the lower redistribution seed layer 220S included in the extending pad via pattern may cover both the via pad seed layer 330S and the via pad conductive layer 330M exposed within the via pad recess 330R.

The top surface of the first extending via pattern RV1e may be at a vertical level higher than each of the bottom surface of the first chip connection pad 120a, the bottom surface of the second chip connection pad 120b, the bottommost surface of the via pad 330, the bottom surface of the expanded structure 310, and the bottom surface of the cover insulating layer 350. In the first extending via pattern RV1e, the top surface of the extending pad via pattern may be at a vertical level higher than the top surface of the extending chip via pattern in the first extending via pattern RV1e.

A top surface of the second via pattern RV2 may contact a bottom surface of the lower redistribution line pattern 222 connected with the second via pattern RV2 on top of the second via pattern RV2. The bottom surface of the lower redistribution line pattern 222 connected with the via pattern RV2 on top of the second via pattern RV2 may be even. In some example embodiments, the top surface of the second via pattern RV2 may be at a same vertical level as the bottom surface of the lower redistribution line pattern 222 connected with the second via pattern RV2 on top of the second via pattern RV2.

In the semiconductor package 10a according to the inventive concepts, from among the lower redistribution via patterns 224, a lower redistribution via pattern 224 connected with the first chip connection pad 120a, the second chip connection pad 120b, or the via pad 330, that is, the first extending via pattern RV1e, may extend into the first chip connection pad 120a, the second chip connection pad 120b, or the via pad 330 while filling the chip pad recess 120R or the via pad recess 330R, and thus, the junction intensity between the first extending via pattern RV1e and the first chip connection pad 120a, the second chip connection pad 120b, or the via pad 330 may increase.

Accordingly, even when stress is concentrated among the lower redistribution layer 200a and the at least one semiconductor chip 100 and the expanded layer 300 arranged on the lower redistribution layer 200a, the junction interface between the first extending via pattern RV1e and the first chip connection pad 120a, the second chip connection pad 120b, and the via pad 330 may be not damaged, and thus, the reliability in electrical connection in the semiconductor package 10a may be improved.

Figure 3A:
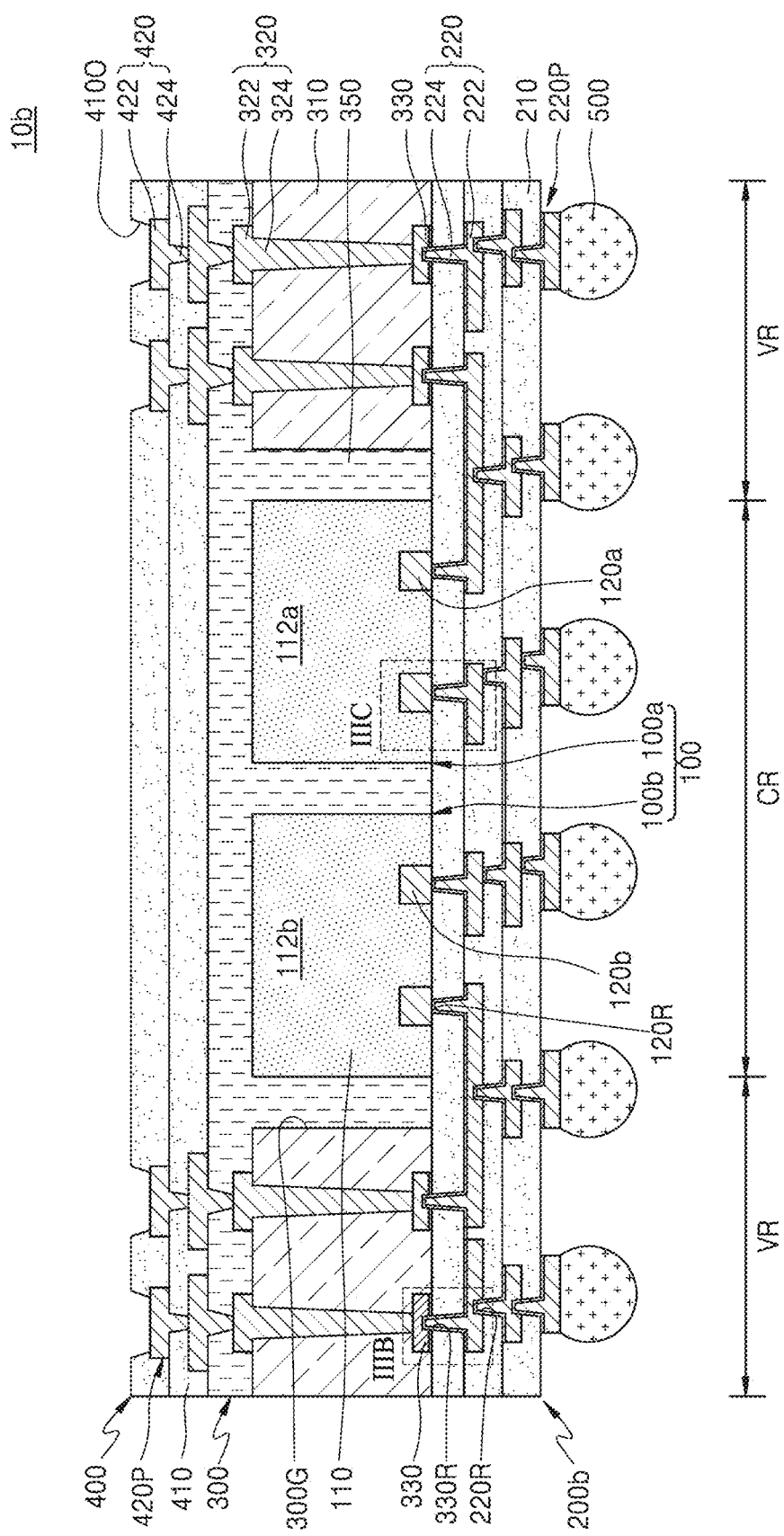
FIGS. 3A, 3B, and 3C are cross-sectional views of a semiconductor package according to some example embodiments.
Figure 3B:
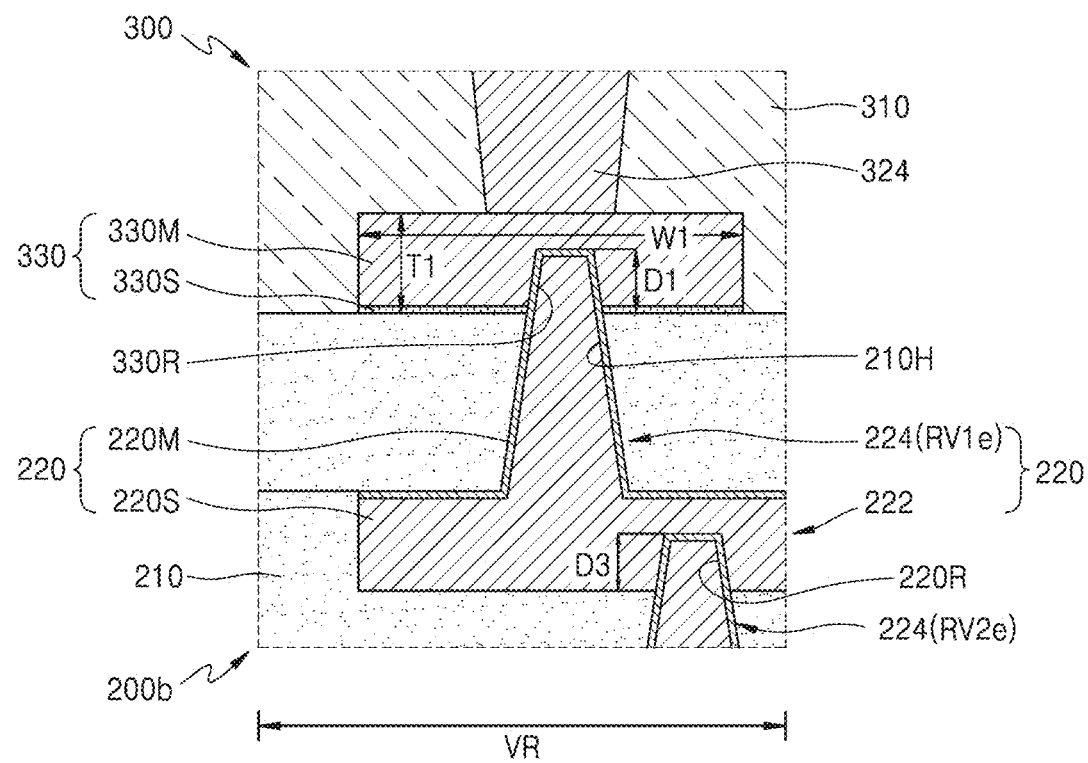
Figure 3C:
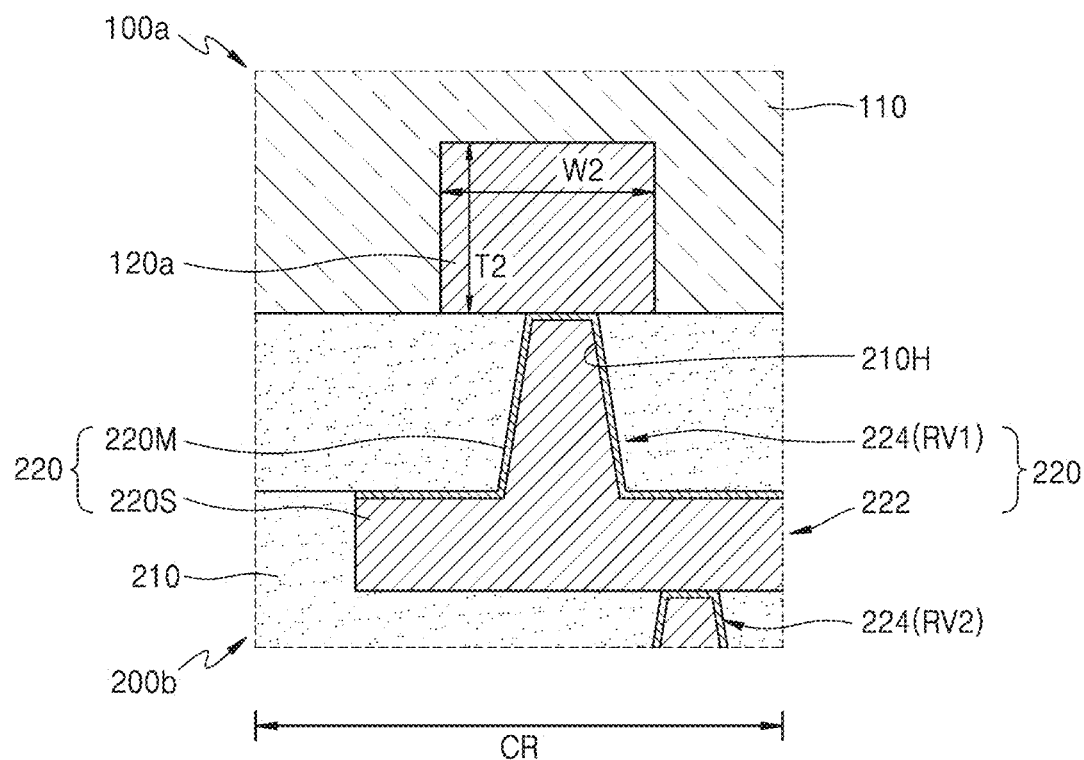

FIGS. 3A, 3B, and 3C are cross-sectional views of a semiconductor package according to embodiments. More particularly, FIGS. 3B and 3C are enlarged cross-sectional views of portions IIIB and IIIC shown in FIG. 3A, respectively. Throughout FIGS. 3A to 3C, same component names as those of FIGS. 1A to 2C indicate substantially same components or generally same components with some modification. Same reference numerals indicate substantially same components, and same descriptions as those with reference to FIGS. 1A to 2C may be omitted.

Referring to FIGS. 3A to 3C, a semiconductor package 10b may include a lower redistribution layer 200b, the expanded layer 300 arranged on the lower redistribution layer 200b and having the mounting space 300G, and the at least one semiconductor chip 100 in the mounting space 300G. In some example embodiments, the semiconductor package 10b may include a lower package of PoP.

The lower redistribution layer 200b may include the at least one lower redistribution insulating layer 210 and the lower redistribution conductive structure 220. The at least one lower redistribution insulating layer 210 may surround at least a portion of the lower redistribution conductive structure 220. The lower redistribution conductive structure 220 may include: the lower redistribution line patterns 222 arranged on at least one of the top surface and the bottom surface of the at least one lower redistribution insulating layer; and the lower redistribution via patterns 224 each being in contact with a portion of the lower redistribution line patterns through at least a portion of the at least one lower redistribution insulating layer 210. The lower redistribution conductive structure 220 may connect the via pad 330 and the external connection terminal 500.

From among the lower redistribution via patterns 224, each of the lower redistribution via patterns 224 arranged at the topmost end of the lower redistribution layer 200 may be named as the first via patterns RV1 and Rv1e, respectively; and from among the lower redistribution via patterns 224, each of remaining lower redistribution via patterns 224 except the first via pattern RV1 and RV1e may be named as the second via patterns RV2 and RV2e.

From between the first via patterns RV1 and RV1e, the via pattern further extending upward from the top surface of the lower redistribution insulating layer 210 to the vertical level higher than the top surface of the lower redistribution insulating layer 210 may be named as the first extending via pattern RV1e, and remaining ones may be named as the first basic via pattern RV1. From among the second via patterns RV2 and RV2e, second via patterns further extending from the bottom surface of the lower redistribution line pattern 222 into the lower redistribution line pattern 222 to a vertical level higher than the bottom surface of the lower redistribution line pattern 222 connected with the top of the second via patterns RV2 and RV2e may be named as the second extending via pattern RV2e, and remaining second via patterns may be named as the second basic via patterns RV2.

The first via patterns RV1 and RV1e may be connected with any one of the first chip connection pad 120a, the second chip connection pad 120b, and the via pad 330 on top of the first via patterns RV1 and RV1e, and the second via patterns RV2 and RV2e may be connected with any one lower redistribution line pattern 222 on top of the second via patterns RV2 and RV2e from among the lower redistribution line patterns 222.

The via pad 330 may have the first horizontal width W1 and the first thickness T1. The via pad 330 may have the via pad recess 330R extending inward from the bottom surface of the via pad 330. The via pad recess 330R may extend into the via pad conductive layer 330M through the via pad seed layer 330S. From among the lower redistribution via patterns 224, the lower redistribution via pattern 224 connected with the via pad 330 may extend into the via pad 330 while filling the via pad recess 330R. Each of the first chip connection pads 120a and the second chip connection pads 120b may have the horizontal width W2 and the second thickness T2.

The redistribution recess 220R may extend into (and may be at least partially defined by one or more surfaces of) the lower redistribution line pattern 222 with the third depth D3 from the bottom surface of the lower redistribution line pattern 222. The third depth D3 may have a value less than a thickness of the lower redistribution line pattern 222. In some example embodiments, the value of the third depth D3 may be from about 10% to about 80% of the value of the lower redistribution line pattern 222. The third depth D3 may be equal to or smaller than the first depth D1. The third depth D3 may be greater than the second depth D2. In some example embodiments, the top surface of the lower redistribution line pattern 222 may be even. For example, the top surface of the lower redistribution line pattern 222, which is opposite to the bottom surface of the lower redistribution line pattern 222 in which the redistribution recess 220R is located, may be even without steps.

Some of the lower redistribution via patterns 224 may electrically connect two lower redistribution line patterns 222 respectively located at different vertical levels. Between the lower redistribution line patterns 222 connected with each other with the lower redistribution via pattern 224 therebetween, the bottom surface of the lower redistribution line pattern 222 at an upper portion may have the redistribution recess 220R filled by the lower redistribution via pattern 224, and the bottom surface of the lower redistribution line pattern 222 at a lower portion may be even without steps. For example, between the lower redistribution line patterns 222 connected with each other with the lower redistribution via pattern 224 therebetween, in the bottom surface of the lower redistribution line pattern 222 located at the lower portion, a portion overlapping in the vertical direction with the redistribution recess 220R or the lower redistribution via pattern 224 may be even without steps.

The lower redistribution line pattern 222, which is connected with the second extending via pattern RV2e and located on the second extending via pattern RV2e, may have the redistribution recess 220R extending inward from the bottom surface of the lower redistribution line pattern 222. The second extending via pattern RV2e may extend into the lower redistribution line pattern 222 while filling the redistribution recess 220R of the lower redistribution line pattern 222 connected with the second extending via pattern RV2e.

The first basic via pattern RV1 and the second basic via pattern RV2 may be arranged in the chip region CR, and the first extending via pattern RV1e and the second extending via pattern RV2e may be arranged in the connection region VR. The top surface of the first basic via pattern RV1 may be at a same vertical level as the top surface of the lower redistribution insulating layer 210. The length of extension of the first extending via pattern RV1e, that is, the height of the first extending via pattern RV1e, may be greater than the height of the first basic via pattern RV1. A top surface of the second basic via pattern RV2 may be at a same vertical level as the bottom surface of the lower redistribution line pattern 222 connected with top of the second basic via pattern RV2. A height of extension of the second extending via pattern RV2e, that is, a height of the second extending via pattern RV2e, may be greater than a height of the second basic via pattern RV2.

In the semiconductor package 10b according to the inventive concepts, from among the lower redistribution via patterns 224, the lower redistribution via patterns 224 arranged in the connection region VR are the first extending via patterns RV1e extending into the via pads 330 while filling the via pad recesses 330R or the second extending via patterns RV2e extending into the lower redistribution line patterns 222 while filling the redistribution recesses 220R. Therefore, in the connection region VR, the junction intensity between the first extending via pattern RV1e and the via pad 330 and between the second extending via pattern RV2e and the lower redistribution line pattern 222 may increase.

Accordingly, even when stress is concentrated to the connection region VR of the semiconductor package 10b, a junction interface between the first extending via pattern RV1e and the via pad 330 and a junction interface between the second extending via pattern RV2e and the lower redistribution line pattern 222 may be not damaged, and thus, the reliability in electrical connection in the semiconductor package 10b may be improved.

Figure 4A:
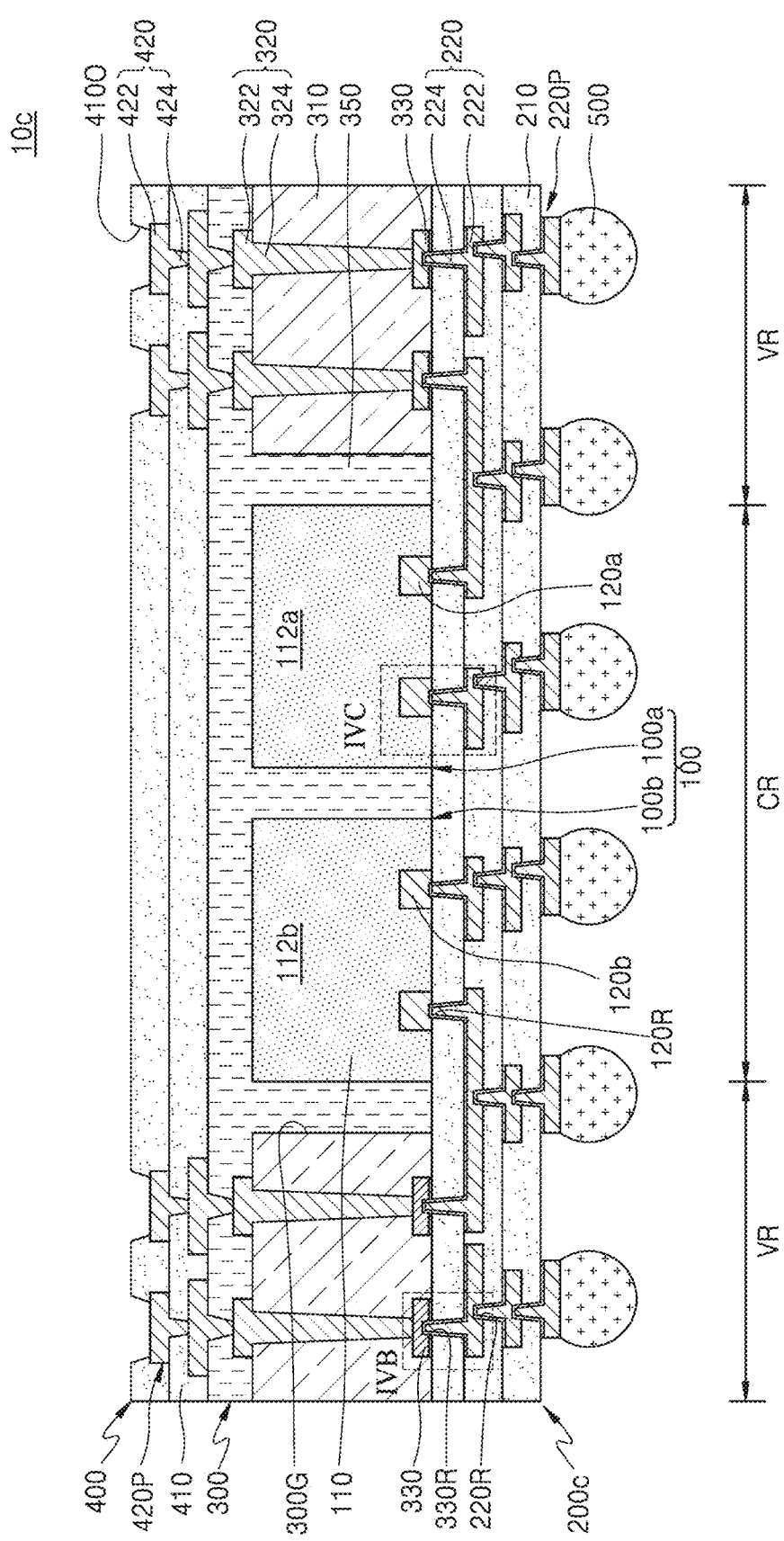
FIGS. 4A, 4B, and 4C are cross-sectional views of a semiconductor package according to some example embodiments.
Figure 4B:
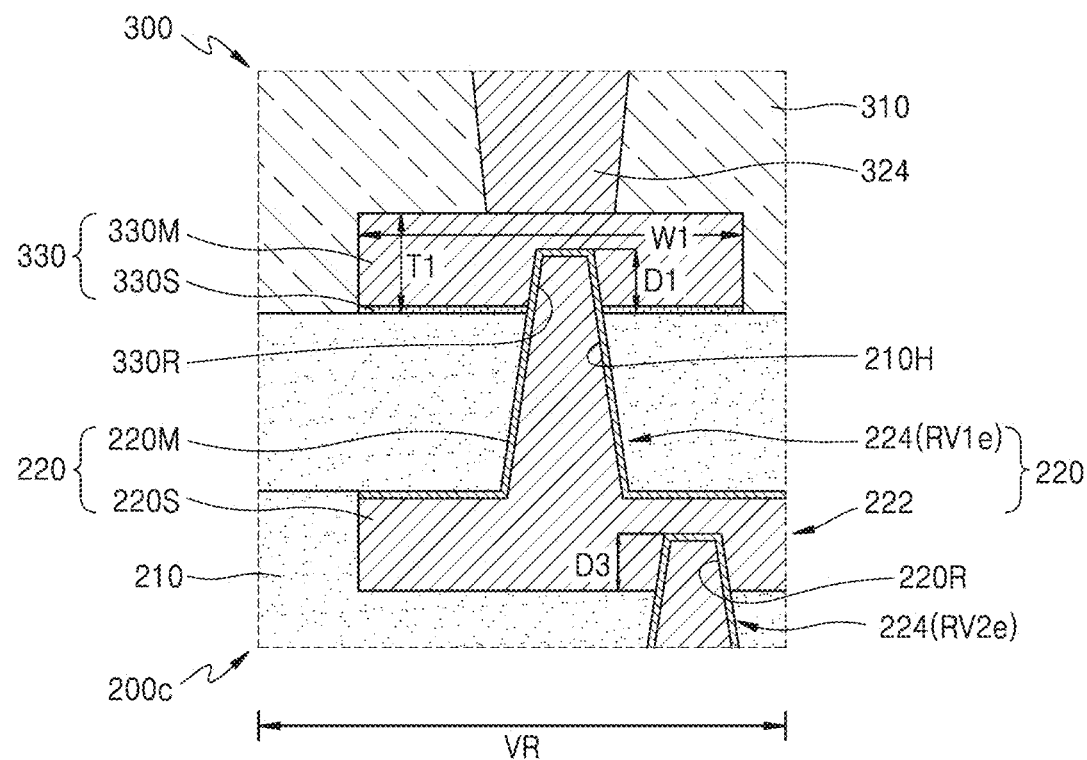
Figure 4C:
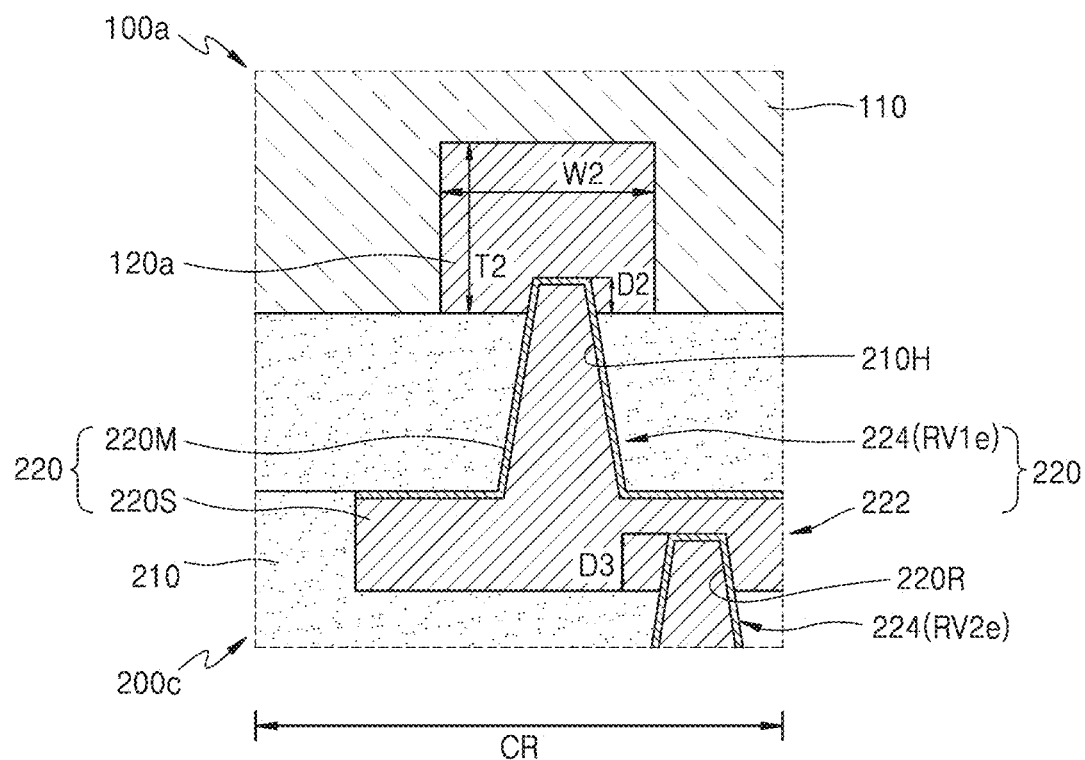

FIGS. 4A, 4B, and 4C are cross-sectional views of a semiconductor package according to some example embodiments. More particularly, FIGS. 4B and 4C are enlarged cross-sectional views of portions IVB and IVC shown in FIG. 4A, respectively. Throughout FIGS. 4A to 4C, same component names as those of FIGS. 1A to 1C indicate substantially identical components or generally same components with some modification. Same reference numerals indicate substantially same components, and same descriptions as those with reference to FIGS. 1A to 1C may be omitted.

Referring to FIGS. 4A to 4C, a semiconductor package 10c may include a lower redistribution layer 200c, the expanded layer 300 arranged on the lower redistribution layer 200c and having the mounting space 300G, and the at least one semiconductor chip 100 arranged in the mounting space 300G. In some example embodiments, the semiconductor package 10c may include a lower package of PoP.

The lower redistribution layer 200c may include the at least one lower redistribution insulating layer 210 and the lower redistribution conductive structure 220. The at least one lower redistribution insulating layer 210 may surround at least a portion of the lower redistribution conductive structure 220. The lower redistribution conductive structure 220 may include: the lower redistribution line patterns 222 arranged on at least one of the top surface and the bottom surface of the at least one lower redistribution insulating layer 210; and the lower redistribution via patterns 224 each being in contact and connection with some of the lower redistribution line patterns 222 through at least a portion of the at least one lower redistribution insulating layer 210. The lower redistribution conductive structure 220 may connect the via pad 330 and the external connection terminal 500.

The via pad 330 may have the first horizontal width W1 and the first thickness T1. The via pad 330 may have the via pad recess 330R extending inward from the bottom portion of the via pad 330. The via pad recess 330R may extend into the via pad conductive layer 330M through the via pad seed layer 330S. The via pad recess 330R may extend into the via pad 330 with the first depth D1 from the bottom surface of the via pad 330.

The first chip connection pads 120a and the second chip connection pads 120b may each have the second horizontal width W2 and the second thickness T2. Each of the first chip connection pads 120a and the second chip connection pads 120b may have the chip pad recess 120R extending inward from the bottom surface of each of the first chip connection pads 120a and the second chip connection pads 120b. The chip pad recess 120R may extend into each of the first chip connection pads 120a and the second chip connection pads 120b with the second depth D2 from the top surface of each of the first chip connection pads 120a and the second chip connection pads 120b.

The lower redistribution line pattern 222, which is connected with the second extending via pattern RV2e and located on top of the second extending via pattern RV2e, may have the redistribution recess 220R extending from the bottom surface of the lower redistribution line pattern 222 into the lower redistribution line pattern 222. The second extending via pattern RV2e may extend into the lower redistribution line pattern 222 while filling the redistribution recess 220R of the lower redistribution line pattern 222 connected with the second extending via pattern RV2e.

The redistribution recess 220R may extend into the lower redistribution line pattern 222 with the third depth D3 from the bottom surface of the lower redistribution line pattern 222. The third depth D3 may have a value less than a thickness of the lower redistribution line pattern 222. In some example embodiments, the value of the third depth D3 may be from about 10% to about 80% of the value of the lower redistribution line pattern 222. The third depth D3 may be equal to or smaller than the first depth D1. The third depth D3 may be greater than the second depth D2. In some example embodiments, the top surface of the lower redistribution line pattern 222 may be even. For example, the top surface of the lower redistribution line pattern 222, which is opposite to the bottom surface of the lower redistribution line pattern 222 in which the redistribution recess 220R is located, may be even without steps.

The via pad recess 330R, the chip pad recess 120R, and the redistribution recess 220R may extend inward from the bottom surface of the via pad 330, the bottom surface of the first chip connection pad 120a or the second chip connection pad 120b, and the bottom surface of the lower redistribution line pattern 222. Therefore, in the present specification, the via pad recess 330R, the chip pad recess 120R, and the redistribution recess 220R may be collectively named as bottom surface recesses. For example, in some example embodiments, each lower redistribution via pattern 224 may connect a first lower redistribution line pattern 222 at a lower position of the lower redistribution via pattern 224 with a particular element at an upper position of the lower redistribution via pattern 224, the particular element being one of a via pad 330, a chip connection pad (e.g., the first chip connection pad 120a or the second chip connection pad 120b), or a second lower redistribution line pattern 222 of the plurality of lower redistribution line patterns, wherein at least one particular element of the particular elements to which the plurality of lower redistribution via patterns 224 are connected at respective upper positions has a bottom surface and at least partially defines a bottom surface recess (e.g., 330R, 120R, and/or 220R) extending inward from the bottom surface, and wherein a bottom surface of a portion of one or more of the first lower redistribution line patterns 222 to which the plurality of lower redistribution via patterns 224 are connected at respective lower positions is planar.

From among the lower redistribution via patterns 224, the lower redistribution via pattern 224 connected with the via pad 330 may extend into the via pad 330 while filling the via pad recess 330R. From among the lower redistribution via patterns 224, the lower redistribution via patterns 224 connected with the first chip connection pad 120*a* or the second chip connection pads 120*b* may extend into the first chip connection pad 120*a* or the second chip connection pads 120*b* while filling the chip pad recess 120R.

From among the lower redistribution via patterns 224, each of the lower redistribution via patterns 224 arranged at a top of the lower redistribution layer 200 may be named as the first via pattern RV1e, and from among the lower redistribution via patterns 224, each of remaining lower redistribution via patterns 224 except the first via patterns RV1e may be named as the second via pattern RV2e.

The first via pattern RV1e may be connected with any one of the first chip connection pad 120*a*, the second chip connection pad 120*b*, and the via pad 330 on top of the first via pattern RV1e, and the second via pattern RV2e may be connected with any one of the lower redistribution line pattern 222 on the second via pattern RV2 from among the lower redistribution line patterns 222.

The first via pattern RV1e, which is connected with any one of the first chip connection pad 120*a*, the second chip connection pad 120*b*, and the via pad 330 on top of the first via pattern RV1e, may further extend upward from the top surface of the lower redistribution insulating layer 210 to a vertical level higher than the bottom surface of the lower redistribution insulating layer 210, and thus may be named as the first extending via pattern RV1e.

The second via pattern RV2e, which is connected with the lower redistribution line pattern 222 on top of the second via pattern RV2e, further extends from the bottom surface of the lower redistribution line pattern 222 into the lower redistribution line pattern 222 to a vertical level higher than the bottom surface of the lower redistribution line pattern 222, and thus may be named as the second extending via pattern RV2e.

In the semiconductor package 10*c* according to the inventive concepts, the lower redistribution via patterns 224 include: the first extending via pattern RV1e extending into the first chip connection pad 120*a*, the second chip connection pad 120*b*, or the via pad 330 while filling the chip pad recess 120R or the via pad recess 330R; or the second extending via pattern RV2e extending into the lower redistribution line pattern 222 while filling the redistribution recess 220R, and therefore, the junction intensity among the lower redistribution via patterns 224, the first chip connection pad 120*a*, the second chip connection pad 120*b*, the via pad 330, and the lower redistribution line pattern 222 may increase.

Accordingly, a junction interface among the lower redistribution via patterns 224, the first chip connection pad 120*a*, the second chip connection pad 120*b*, the via pad 330, and the lower redistribution line pattern 222 may not be damaged, and thus, the reliability in electrical connection in the semiconductor package 10 may be improved.

FIGS. 5A, 5B, 5C, 5D, and 5E are cross-sectional views of a method of manufacturing the semiconductor package, according to some example embodiments. More particularly, FIGS. 5A to 5E are cross-sectional views of the method of manufacturing the semiconductor package 10 shown in FIGS. 1A to 1C. Same component names as those of FIGS. 1A to 1C indicate same components as those of FIGS. 1A to 1C, same reference numerals indicate substantially same components, and same descriptions as those with reference to FIGS. 1A to 1C may be omitted.

Figure 5A:
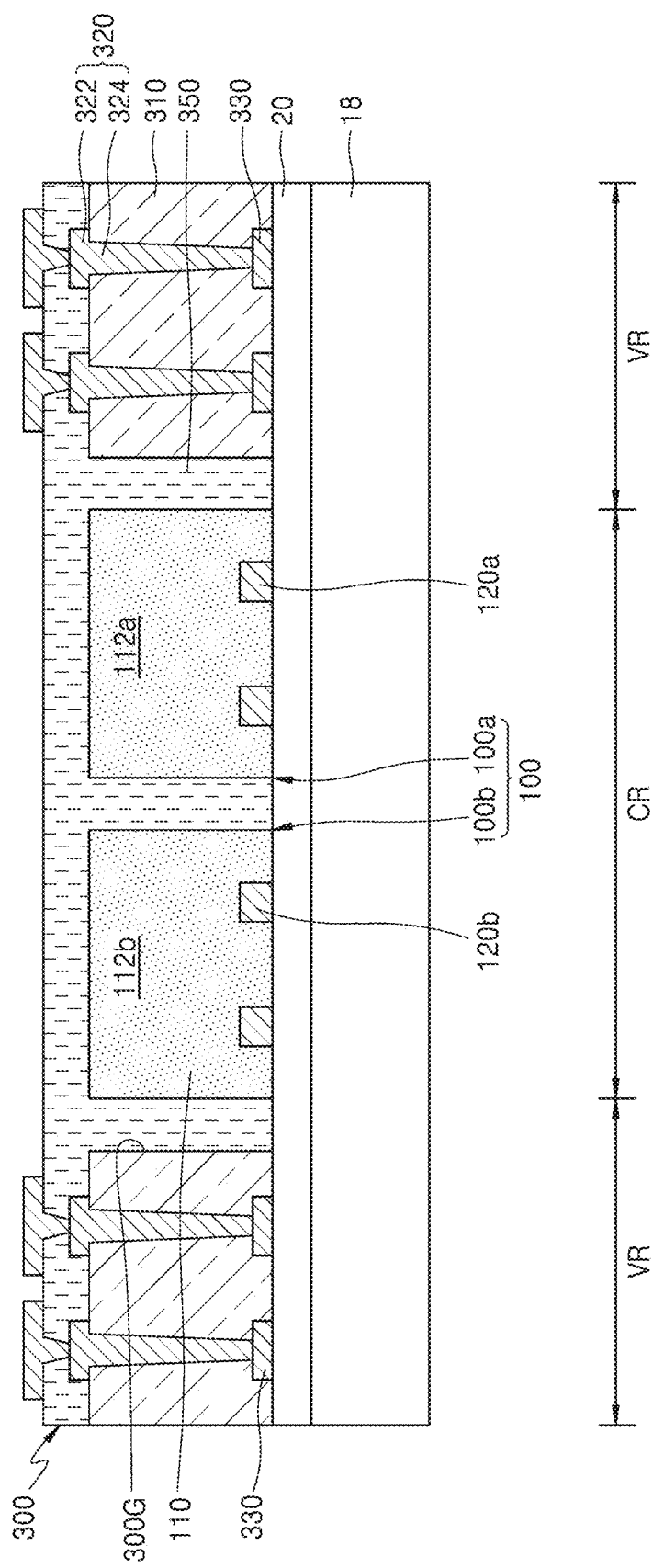
FIGS. 5A, 5B, 5C, 5D, and 5E are cross-sectional views of a method of manufacturing a semiconductor package, according to some example embodiments.

Referring to FIG. 5A, the expanded layer 300 having the mounting space 300G is attached above the first support substrate 18 onto which a first release film 20 is attached, and the at least one semiconductor chip 100 is arranged in the mounting space 300G. The at least one semiconductor chip 100 may be arranged in the mounting space 300G to be apart from the inner side of the mounting space 300G. The at least one semiconductor chip 100 and the expanded layer 300 may be attached onto the first release film 20.

The expanded layer 300 may include the expanded structure 310, the via structure 320, and the via pad 330. The at least one semiconductor chip 100 may be in the chip region CR, and the expanded structure 310 and the via structure 320, which are included in the expanded layer 300, may be in the connection region VR.

The at least one semiconductor chip 100 may include, for example, the first semiconductor chip 100*a* and the second semiconductor chip 100*b*. In some example embodiments, the first semiconductor chip 100*a* and the second semiconductor chip 100*b* may be arranged in the mounting space 300G to be apart from each other in the horizontal direction.

Each of the first semiconductor chip 100*a* and the second semiconductor chip 100*b* may include the semiconductor substrate 110. The first semiconductor chip 100*a* may include the first semiconductor device 112*a* arranged on the active surface of the semiconductor substrate 110 and the first chip connection pads 120*a* arranged on the active surface of the semiconductor substrate 110; and the second semiconductor chip 100*b* may include the second semiconductor device 112*b* arranged on the active surface of the semiconductor substrate 110 and the second chip connection pads 120*b* arranged on the active surface of the semiconductor substrate 110.

The expanded layer 300 may be attached onto the first support substrate 18 onto which the first release film 20 is attached, such that the via pad 330 faces the first support substrate 18 onto which the first release film 20 is attached. The first semiconductor chip 100*a* and the second semiconductor chip 100*b* may be attached above the first support substrate 18 to which the first release film 20 is attached, such that the first chip connection pads 120*a* and the second chip connection pads 120*b* face the first support substrate 18 onto which the first release film 20 is attached.

Thereafter, the cover insulating layer 350 filling the mounting space 300G is formed. The cover insulating layer 350 may fill the space between the semiconductor chip 100 and the expanded structure 310. The cover insulating layer 350 may fill the space between the semiconductor chip 100 and the expanded structure 310, and may cover the top surfaces of the semiconductor chip 100 and the expanded layer 300.

Figure 5B:
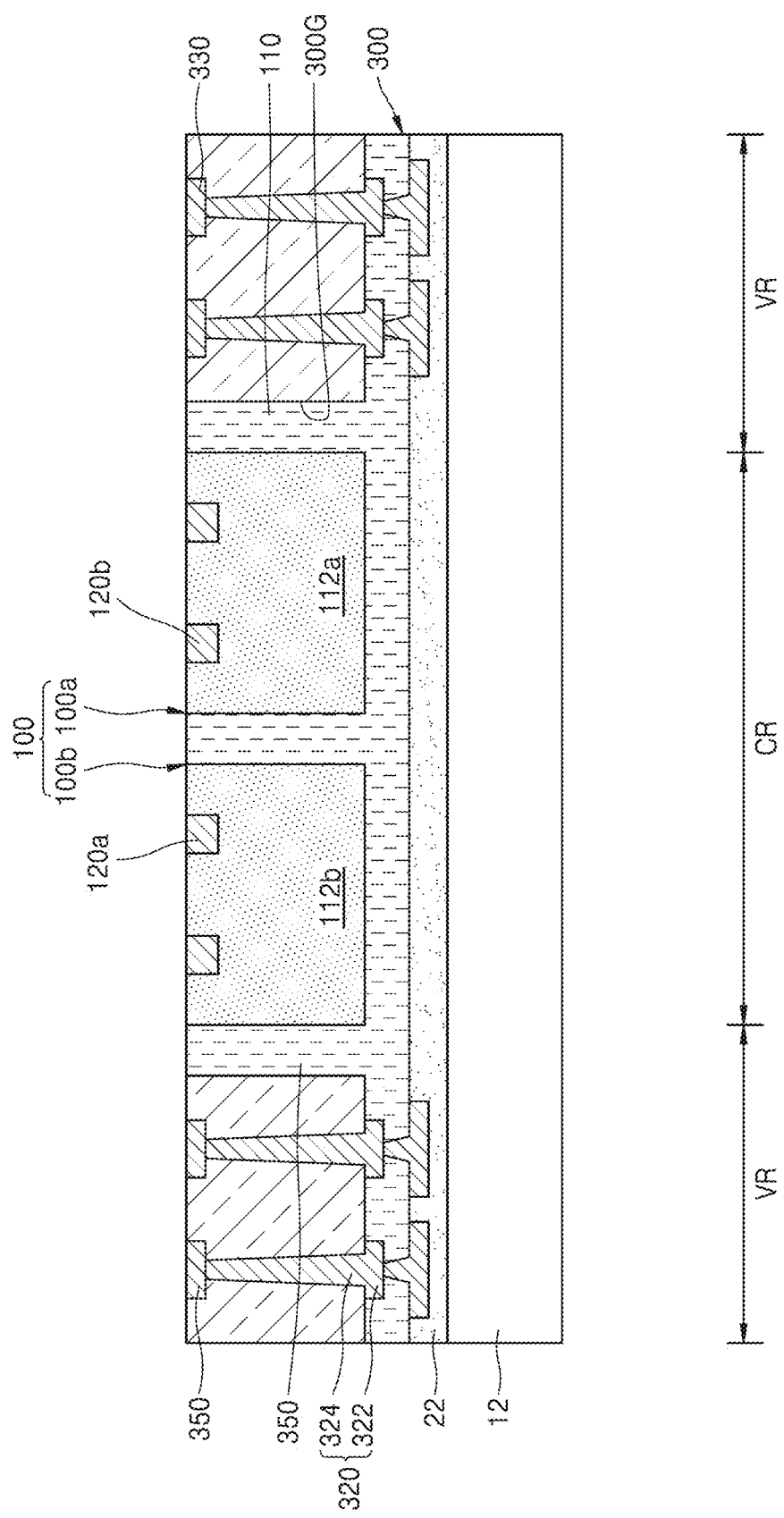

Referring to FIGS. 5A and 5B, from the first support substrate 18 onto which the first release film 20, a structure including the at least one semiconductor chip 100, the expanded layer 300, and the cover insulating layer 350 is separated is separated from the first support substrate 18 onto which the first release film 20 is attached. Next, the structure including the at least one semiconductor chip 100, the expanded layer 300, and the cover insulating layer 350 is turned upside down and mounted above a second support substrate 12 onto which a second release film 22 is attached.

Figure 5C:
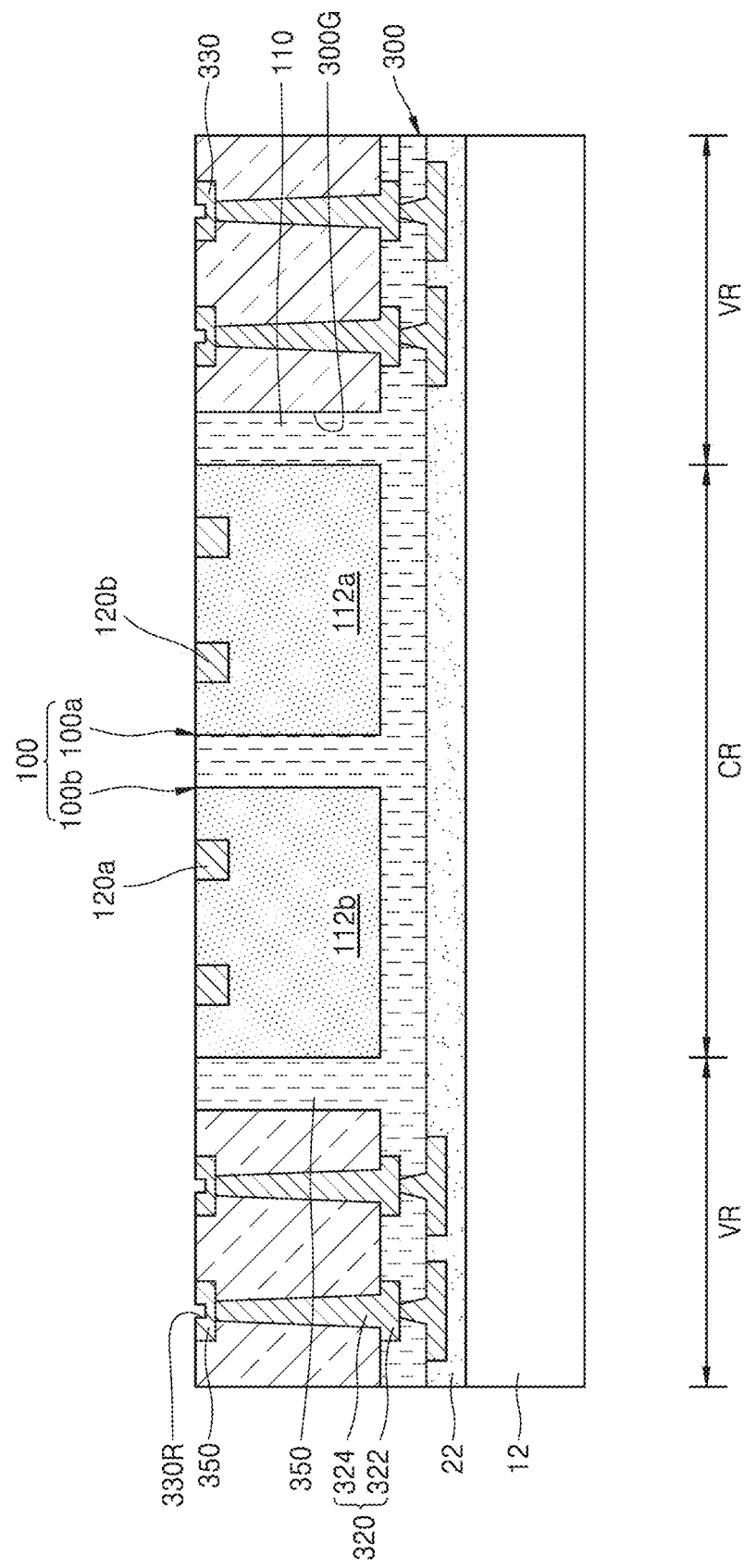

Referring to FIG. 5C, a portion of the via pad 330 is removed to form the via pad recess 330R extending inward from the top surface of the via pad 330. The via pad recess 330R may extend into the via pad with the first depth D1 (see FIG. 1B) from the top surface of the via pad 330. The via pad recess 330R may be formed such that the first depth D1 has a value smaller than the first thickness T1 (see FIG. 1B) of the via pad 330.

Figure 5D:
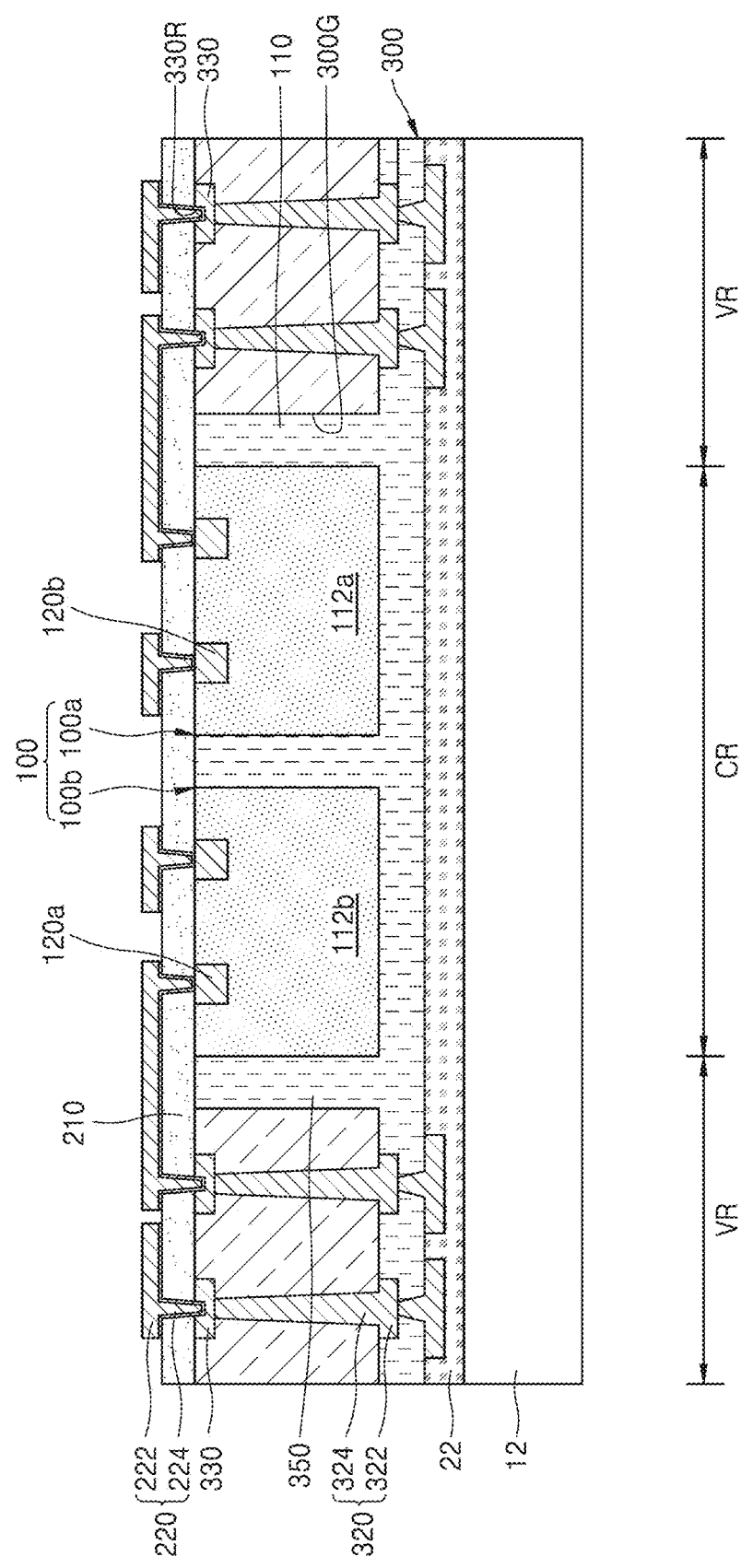

Referring to FIG. 5D, the lower redistribution conductive structure 220 including the lower redistribution insulating layer 210, the lower redistribution line patterns 222, and the lower redistribution via patterns 224 is formed. The lower redistribution via patterns 224 may be connected with the first chip connection pads 120a, the second chip connection pads 120b, and the via pads 330 through the lower redistribution insulating layer 210. From among the lower redistribution via patterns 224, the lower redistribution via patterns 224 connected with the via pads 330 may respectively extend into the via pads 330 while filling the via pad recesses 330R of the via pads 330.

Figure 5E:
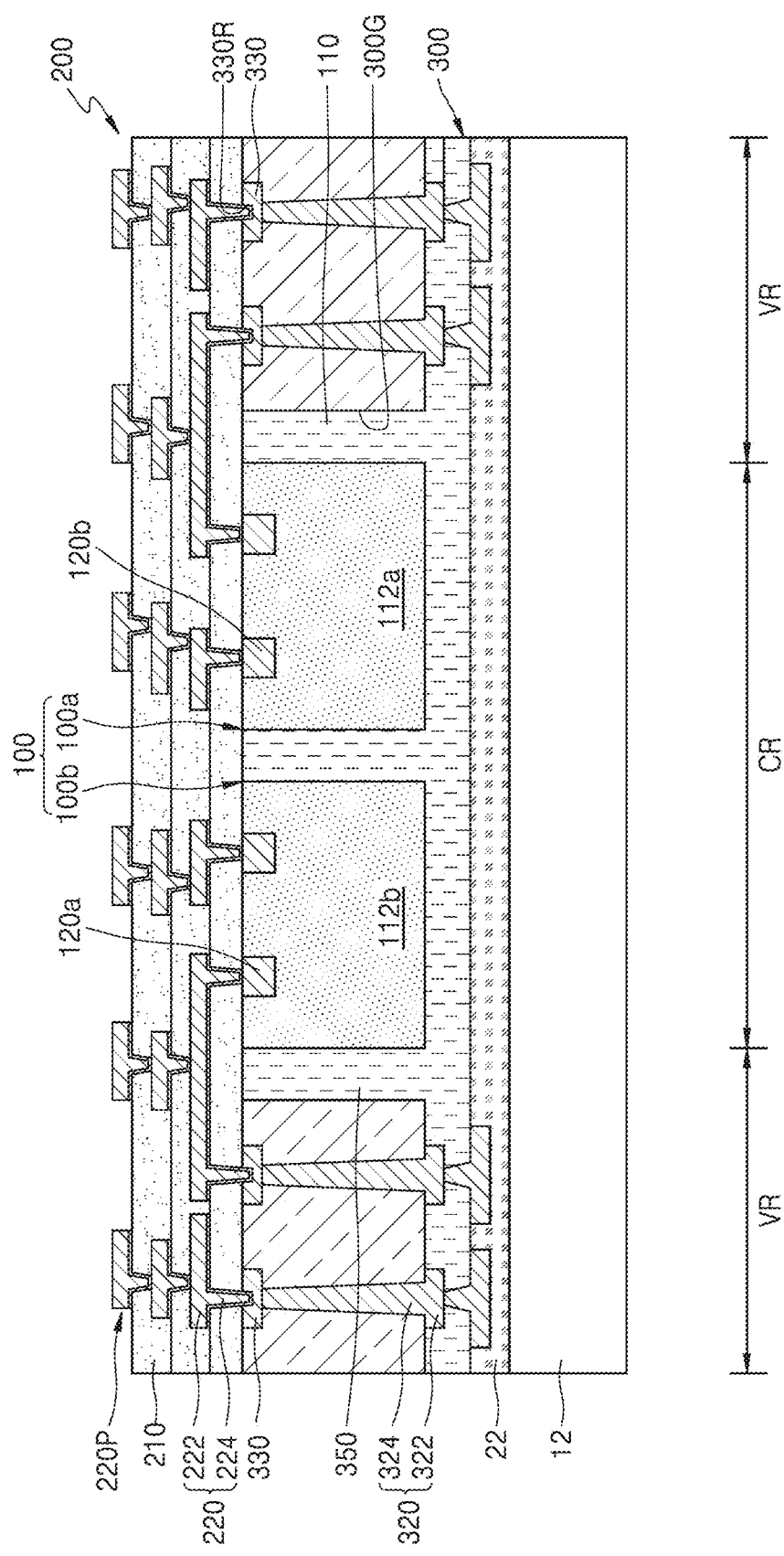

Referring to FIG. 5E, the lower redistribution conductive structure 220 including the lower redistribution insulating layer 210, the lower redistribution line patterns 222, and the lower redistribution via patterns 224 is repeatedly formed, to thereby form the lower redistribution layer 200 on the structure including the at least one semiconductor chip 100, the expanded layer 300, and the cover insulating layer 350.

Next, as shown in FIGS. 1A to 1C, the semiconductor package 10 may be formed by attaching the external connection terminals 500 to the terminal connection pad 220P, turning the structure including the at least one semiconductor chip 100, the expanded layer 300, and the cover insulating layer 350 upside-down, and forming the upper redistribution layer 400 on the structure including the at least one semiconductor chip 100, the expanded layer 300, and the cover insulating layer 350.

Figure 6:
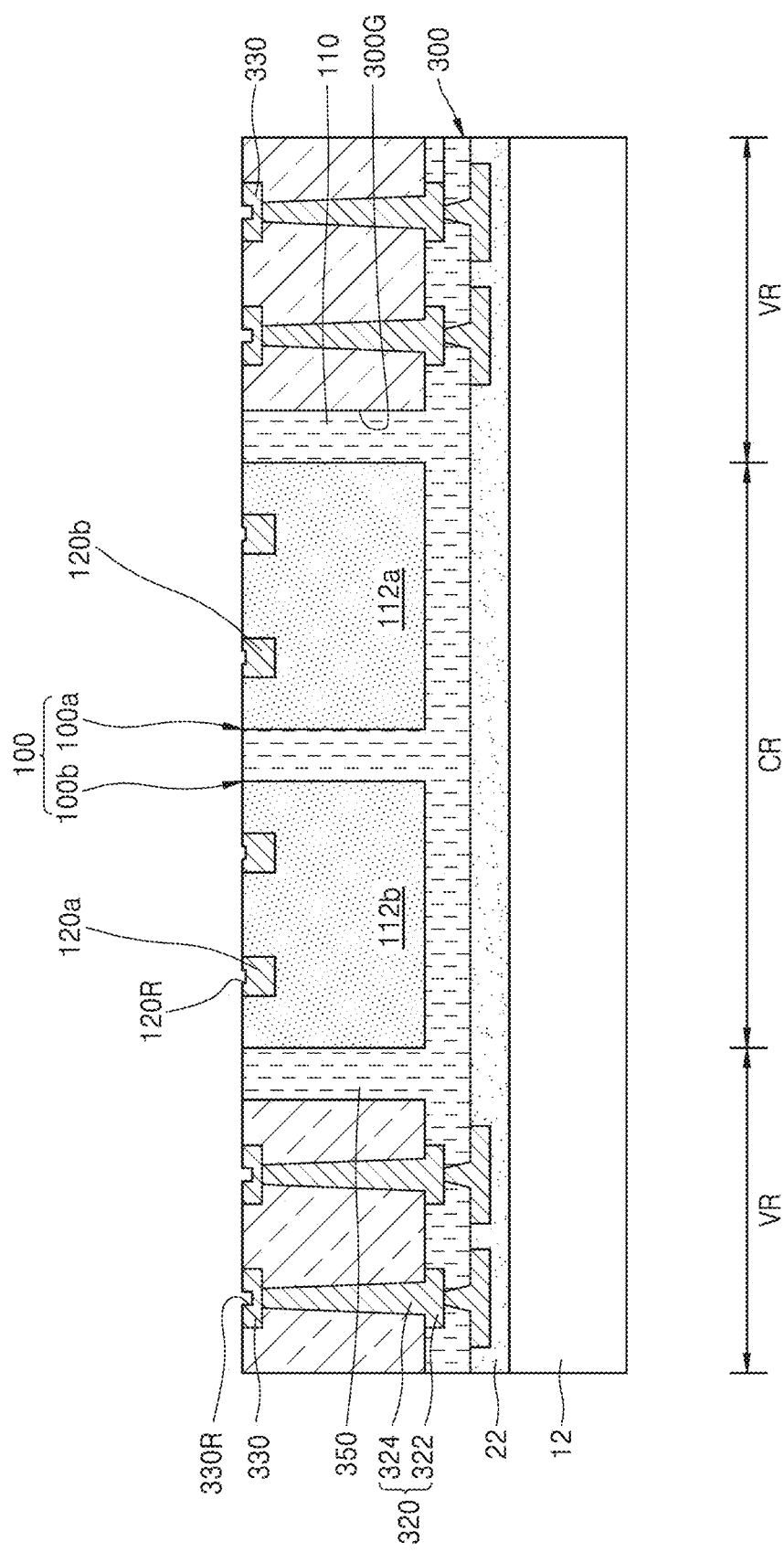
FIG. 6 is a cross-sectional view of a method of manufacturing a semiconductor package, according to some example embodiments.

FIG. 6 is a cross-sectional view of a method of manufacturing the semiconductor package according to some example embodiments. More particularly, FIG. 6 is a cross-sectional view for describing the method of manufacturing the semiconductor package 10a shown in FIGS. 2A to 2C. Same component names as those of FIGS. 1A to 1C indicate same components as those of FIGS. 1A to 1C. Same reference numerals indicate substantially same components, and same descriptions as those with reference to FIGS. 1A to 1C may be omitted.

Referring to FIG. 6, with respect to the semiconductor package shown in FIG. 5B, a portion of the first chip connection pad 120a and a portion of the second chip connection pad 120b are removed to form the chip pad recess 120R extending from the top surfaces of the first chip connection pad 120a and the second chip connection pad 120b into the first chip connection pad 120a and the second chip connection pad 120b, and a portion of the via pad 330 is removed to form the via pad recess 330R extending from the top surface of the via pad 330 into the via pad 330.

The via pad recess 330R may extend into the via pad 330 with the first depth D1 (see FIG. 2B) from the top surface of the via pad 330. The via pad recess 330R may be formed such that the first depth D1 has a value smaller than that of the second thickness T2 (see FIG. 2B) of the via pad 330.

The chip pad recess 120R may extend into the first chip connection pad 120a and the second chip connection pad 120b with the second depth D2 (see FIG. 2C) from the top surfaces of the first chip connection pad 120a and the second chip connection pad 120b. The chip pad recess 120R may be formed such that the second depth D2 has a value smaller than the second thickness T2 (see FIG. 2C) of the first chip connection pad 120a and the second chip connection pad 120b.

Next, referring to the methods described with reference to FIGS. 5D to 5E, the semiconductor package 10b shown in FIGS. 2A to 2C may be formed.

Figure 7:
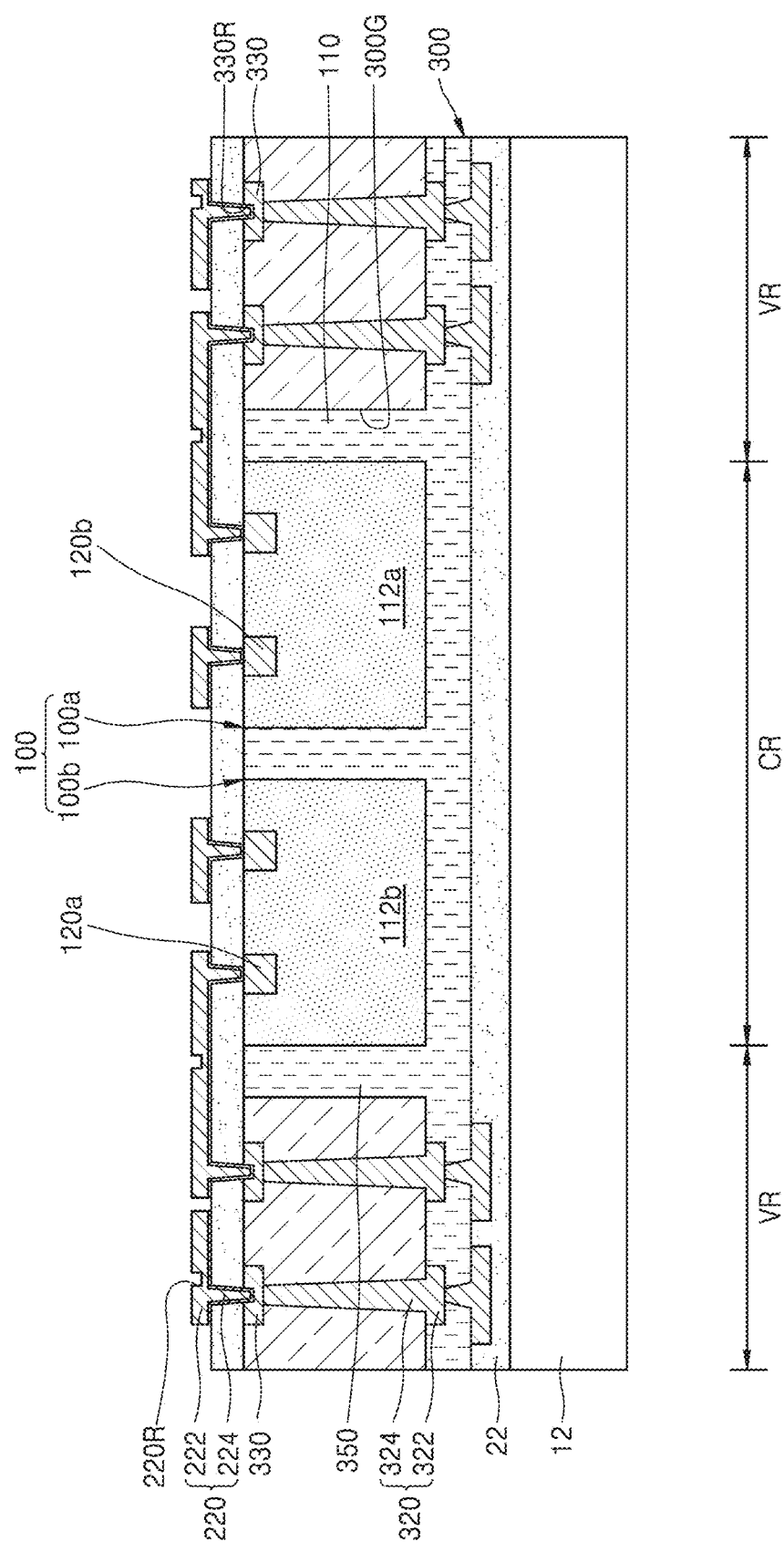
FIG. 7 is a cross-sectional view of a method of manufacturing a semiconductor package, according to some example embodiments.

FIG. 7 is a cross-sectional view of a method of manufacturing a semiconductor package according to some example embodiments. More particularly, FIG. 7 is a cross-sectional view for describing the method of manufacturing the semiconductor package 10b shown in FIGS. 3A to 3C. Same component names as those of FIGS. 3A to 3C indicate same components as those of FIGS. 3A to 3C, same reference numerals indicate substantially same components, and same descriptions as those with reference to FIGS. 1A to 3C may be omitted.

Referring to FIG. 7, with respect to the semiconductor package shown in FIG. 5D, a portion of the lower redistribution line pattern 222 is removed to form the redistribution recess 220R extending from the top surface of the lower redistribution line pattern 222 into the lower redistribution line pattern 222. The redistribution recess 220R may be formed only in the lower redistribution line patterns 222 arranged in the connection region VR, and may be not formed in the lower redistribution line patterns 222 arranged in the chip region CR.

The redistribution recess 220R may extend into the lower redistribution line pattern with the third depth D3 (see FIG. 3B) from the top surface of the lower redistribution line pattern 222. The redistribution recess 220R may be formed such that the first depth (the third depth?) D3 has a value smaller than that of the thickness of the lower redistribution line pattern 222.

Next, the semiconductor package 10b shown in FIGS. 3A to 3C may be formed with reference to the method described with reference to FIGS. 7 and 5E.

Although not shown, the redistribution recess 220R described with reference to FIG. 7 may be formed in both the lower redistribution line patterns 222 arranged in the connection region VR and the lower redistribution line pattern 222 arranged in the chip region CR to form the semiconductor package 10c shown in FIGS. 4A to 4C.

While the inventive concepts have been particularly shown and described with reference to some example embodiments thereof, it will be understood that various changes in form and details may be made therein without departing from the spirit and scope of the following claims.

What is claimed is:

1. A semiconductor package, comprising:
   a lower redistribution layer including a plurality of lower redistribution line patterns, a plurality of lower redistribution via patterns, and a lower redistribution insulating layer surrounding the plurality of lower redistribution line patterns and the plurality of lower redistribution via patterns;
   an expanded layer including one or more surfaces at least partially defining a mounting space, the expanded layer including, on the lower redistribution layer, a via pad, an expanded structure covering the via pad, and an extending via portion connected with the via pad through the expanded structure, the via pad including one or more surfaces at least partially defining a via pad recess extending from a bottom surface of the via pad into the via pad; and a semiconductor chip in the mounting space, on the lower redistribution layer, wherein, from among the plurality of lower redistribution via patterns, one lower redistribution via pattern connected with the via pad extends into the via pad while filling the via pad recess, to electrically connect the via pad with one lower redistribution line pattern of the plurality of lower redistribution line patterns, wherein a bottom surface of a portion of the one lower redistribution line pattern that is connected with the via pad is planar, and wherein a bottommost surface of the via pad and a bottom surface of the expanded structure are at a same vertical level and coplanar with each other.

2. The semiconductor package of claim 1, wherein at least one lower redistribution via pattern from among the plurality of lower redistribution via patterns electrically connects two lower redistribution line patterns at different vertical levels from among the plurality of lower redistribution line patterns, a bottom surface of a lower redistribution line pattern at an upper position from among the two lower redistribution line patterns includes one or more surfaces at least partially defining at least one redistribution recess filled with the at least one lower redistribution via pattern from among the plurality of lower redistribution via patterns and extending inward from the bottom surface, and a bottom surface of a lower redistribution line pattern at a lower position from among the two lower redistribution line patterns is planar.

3. The semiconductor package of claim 2, wherein the at least one redistribution recess does not overlap the semiconductor chip in a vertical direction extending perpendicular to a bottom surface of the lower redistribution layer.

4. The semiconductor package of claim 1, wherein each of the plurality of lower redistribution via patterns has a tapered shape extending with a horizontal width decreasing in a bottom-up manner.

5. The semiconductor package of claim 1, wherein the semiconductor chip comprises a plurality of chip connection pads and is on the lower redistribution layer such that the plurality of chip connection pads face the lower redistribution layer, and a top surface of each lower distribution via pattern of a set of lower redistribution via patterns connected with the plurality of chip connection pads from among the plurality of lower redistribution via patterns is at a vertical level lower than a top surface of the one lower redistribution via pattern that is connected with the via pad.

6. The semiconductor package of claim 5, wherein respective top surfaces of the set of lower redistribution via patterns connected with the plurality of chip connection pads from among the plurality of lower redistribution via patterns are at a same vertical level as a top surface of the lower redistribution insulating layer.

7. The semiconductor package of claim 5, wherein each of the plurality of chip connection pads has a bottom surface and at least partially defines a chip pad recess extending inward from the bottom surface, and the set of lower redistribution via patterns connected with the plurality of chip connection pads from among the plurality of lower redistribution via patterns fill separate, respective chip pad recesses at least partially defined by separate, respective chip connection pads of the plurality of chip connection pads.

8. The semiconductor package of claim 7, wherein a depth of the chip pad recess from a bottom surface of each of the plurality of chip connection pads is less than a depth of the via pad recess from the bottom surface of the via pad.

9. The semiconductor package of claim 5, wherein a thickness of each of the plurality of chip connection pads is greater than a thickness of the via pad.

10. A semiconductor package, comprising:

a lower redistribution layer including a plurality of lower redistribution line patterns, a plurality of lower redistribution via patterns, and a lower redistribution insulating layer surrounding the plurality of lower redistribution line patterns and the plurality of lower redistribution via patterns;

a semiconductor chip in a chip region on the lower redistribution layer, and including a chip connection pad facing the lower redistribution layer; and an expanded layer in a connection region surrounding the chip region on the lower redistribution layer, the expanded layer including a via pad, an expanded structure covering the via pad, an extending via portion penetrating the expanded structure and connected with the via pad, and one or more surfaces at least partially defining a mounting space in which the semiconductor chip is located, wherein each lower redistribution via pattern of the plurality of lower redistribution via patterns connect a separate first lower redistribution line pattern of the plurality of lower redistribution line patterns at a lower position of the lower redistribution via pattern with a particular element of a plurality of particular elements at an upper position of the lower redistribution via pattern, wherein the particular element being one of the via pad, the chip connection pad, or a second lower redistribution line pattern of the plurality of lower redistribution line patterns, wherein separate, respective particular elements of the plurality of particular elements to which the plurality of lower redistribution via patterns are connected at respective upper positions have separate, respective bottom surfaces and at least partially define a separate, respective bottom surface recesses extending inward into the separate, respective particular elements from the separate, respective bottom surfaces, wherein a separate bottom surface of a portion of each separate first lower redistribution line pattern is planar, and wherein a bottommost surface of the via pad and a bottom surface of the expanded structure are at a same vertical level and coplanar with each other.

11. The semiconductor package of claim 10, wherein at least one bottom surface recess of the separate, respective bottom surface recesses comprises a via pad recess extending from a bottom surface of the via pad into the via pad, and from among the plurality of lower redistribution via patterns, a lower redistribution via pattern connected with the via pad extends into the via pad while filling the via pad recess.

12. The semiconductor package of claim 11, wherein the via pad has a stack structure comprising a via pad seed layer and a via pad conductive layer, each of the plurality of lower redistribution via patterns has a stack structure comprising a lower redistribution seed layer and a lower redistribution conductive layer, and the lower redistribution seed layer covers an inner surface of the via pad recess.

13. The semiconductor package of claim 12, wherein, from among the plurality of lower redistribution via patterns, the lower redistribution via pattern connected with the via pad extends into the via pad conductive layer through the via pad seed layer.

14. The semiconductor package of claim 11, wherein at least one bottom surface recess of the separate, respective bottom surface recesses comprises a redistribution recess extending from a bottom surface of the second lower redistribution line pattern into the second lower redistribution line pattern, and from among the plurality of lower redistribution via patterns, a lower redistribution via pattern connected with the second lower redistribution line pattern, under the second lower redistribution line pattern, fills the redistribution recess and extends into the second lower redistribution line pattern.

15. The semiconductor package of claim 14, wherein the redistribution recess is in the connection region and is not in the chip region.

16. The semiconductor package of claim 15, wherein at least one bottom surface recess of the separate, respective bottom surface recesses comprises a chip pad recess extending from a bottom surface of the chip connection pad into the chip connection pad, and from among the plurality of lower redistribution via patterns, a lower redistribution via pattern connected with the chip connection pad extends into the chip connection pad while filling the chip pad recess.

17. The semiconductor package of claim 14, wherein the redistribution recess is in the chip region and the connection region.

18. A semiconductor package, comprising:

a plurality of lower redistribution line patterns, a plurality of lower redistribution via patterns each having a tapered shape extending with a horizontal width decreasing in a bottom-up manner and to which any one of the plurality of lower redistribution line patterns are connected underneath, and a lower redistribution layer comprising a lower redistribution insulating layer surrounding the plurality of lower redistribution line patterns and the plurality of lower redistribution via patterns;

a semiconductor chip in a chip region on the lower redistribution layer and including a chip connection pad facing the lower redistribution layer;

an expanded layer in a connection region surrounding the chip region on the lower redistribution layer, the expanded layer including a via pad, an expanded structure covering the via pad, a via connection pad portion on a top surface of the expanded structure, and an extended via portion connecting the via pad with the via connection pad portion through the expanded structure, the expanded layer including one or more surfaces at least partially defining a mounting space in which the semiconductor chip is located, the via pad at least partially defining a via pad recess extending from a bottom surface of the via pad into the via pad at a depth less than a thickness of the via pad;

a cover insulating layer filling a space defined between the semiconductor chip and the expanded structure;

an upper redistribution conductive structure comprising a plurality of upper redistribution line patterns and a plurality of upper redistribution via patterns and electrically connected with the via connection pad portion;

an upper redistribution insulating layer surrounding the plurality of upper redistribution line patterns and the plurality of upper redistribution via patterns; and an upper redistribution layer on the cover insulating layer, wherein the via pad is connected with one of the plurality of lower redistribution line patterns through a lower redistribution via pattern extending into the via pad while filling the via pad recess, from among the plurality of lower redistribution via patterns, and wherein a bottom surface of a portion of a lower redistribution line pattern connected with the via pad from among the plurality of lower redistribution line patterns is planar.

19. The semiconductor package of claim 18, wherein a depth of the via pad recess from the bottom surface of the via pad is about 10% to about 80% of a thickness of the via pad.

* * * * *